US008236132B2

(12) United States Patent
Yamamoto et al.

(10) Patent No.: US 8,236,132 B2
(45) Date of Patent: Aug. 7, 2012

(54) SUBSTRATE PROCESSING SYSTEM AND SUBSTRATE TRANSFER METHOD

(75) Inventors: Yuichi Yamamoto, Minato-ku (JP); Tadayuki Yamaguchi, Minato-ku (JP); Yasuhito Saiga, Minato-ku (JP); Yoshiaki Yamada, Minato-ku (JP)

(73) Assignee: Tokyo Electron Limited, Tokyo (JP)

( * ) Notice: Subject to any disclaimer, the term of this patent is extended or adjusted under 35 U.S.C. 154(b) by 779 days.

(21) Appl. No.: 12/302,853

(22) PCT Filed: Jun. 15, 2007

(86) PCT No.: PCT/JP2007/062100
§ 371 (c)(1),
(2), (4) Date: Nov. 28, 2008

(87) PCT Pub. No.: WO2007/145314
PCT Pub. Date: Dec. 21, 2007

(65) Prior Publication Data
US 2009/0185151 A1    Jul. 23, 2009

(30) Foreign Application Priority Data

Jun. 15, 2006  (JP) .................................. 2006-165620

(51) Int. Cl.
*B65G 49/07*  (2006.01)
(52) U.S. Cl. .................... 156/345.32; 118/500; 414/935
(58) Field of Classification Search .......................... None
See application file for complete search history.

(56) References Cited

U.S. PATENT DOCUMENTS

| | | | | |
|---|---|---|---|---|
| 6,990,721 | B2 * | 1/2006 | Mariano et al. | 29/469 |
| 8,046,095 | B2 * | 10/2011 | Yamamoto | 700/112 |
| 2004/0237270 | A1 | 12/2004 | Tanaka et al. | |
| 2005/0273191 | A1 * | 12/2005 | Englhardt et al. | 700/112 |

FOREIGN PATENT DOCUMENTS

| | | |
|---|---|---|
| JP | 2000 124124 | 4/2000 |
| JP | 2004 356606 | 12/2004 |
| JP | 2006 41485 | 2/2006 |

OTHER PUBLICATIONS

Office Action issued May 17, 2011 in Japanese Patent Application No. 2006-165620 (with partial English translation).

* cited by examiner

*Primary Examiner* — Dah-Wei Yuan
*Assistant Examiner* — Stephen Kitt
(74) *Attorney, Agent, or Firm* — Oblon, Spivak, McClelland, Maier & Neustadt, L.L.P.

(57) ABSTRACT

A substrate processing system (100) includes a first automated substrate transfer line or main transfer line (20) configured to transfer wafers (W) over the entire system and to transfer wafers to and from respective process sections, and a second automated substrate transfer line or auxiliary transfer line (30) configured to transfer wafers (W) inside a photolithography process section (1*a*). The auxiliary transfer line (30) is disposed as a transfer mechanism independent of the main transfer line (20). An OHT (31) is configured to travel around on the auxiliary transfer line (30) having a loop shape, so as to transfer wafers (W) to and from and among the respective process apparatuses in the photolithography process section (1*a*).

20 Claims, 13 Drawing Sheets

SUBSTRATE PROCESSING SYSTEM AND SUBSTRATE TRANSFER METHOD

TECHNICAL FIELD

The present invention relates to a substrate processing system and substrate transfer method for performing a process including a photolithography sequence on target substrates, such as semiconductor wafers.

BACKGROUND ART

In the process of manufacturing semiconductor devices, a photolithography sequence is repeatedly performed to form patterns on a semiconductor wafer (which may be simply referred to as "wafer" hereinafter). The photolithography sequence comprises a resist coating process for forming a resist film on the surface of a semiconductor wafer, a light exposure process for performing light exposure by use of a light exposure mask on the wafer with the resist film formed thereon, and a developing process for performing development on the wafer after the light exposure. Further, a pre-light-exposure baking (PAB) process is performed before the light exposure process, and a post-light-exposure baking (post-exposure baking; PEB) process is performed after the light exposure process.

In semiconductor manufacturing processes, photolithography sequences are respectively performed by photolithography process sections connected to an AMHS (Automated Material Handling Systems) in the factory. Conventionally, due to process restrictions, each photolithography process section is arranged such that a resist coating/developing process apparatus and light exposure process apparatus are disposed in series as one unit, so that wafers W are transferred between this unit and the AMHS described above (for example, Jpn. Pat. Appln. KOKAI Publication No. 2000-124124 (paragraph 0027 and FIG. 2)). In a conventional apparatus having such layout, a plurality of wafers are transferred from the AMHS by use of cassettes, and are supplied onto the resist coating/developing process apparatus of each photolithography process section in units of a cassette. Then, the wafers W are taken out one by one from the cassette by a transfer mechanism of the resist coating/developing process apparatus, and are subjected to a series of processes, such as resist coating, light exposure, and development.

In recent years, along with improvements of technical nodes in semiconductor devices, i.e., progress of the miniaturization level of semiconductor devices, new techniques, such as double light exposure, have been developed. The double light exposure is arranged to process a wafer with a resist film formed thereon such that, for example, a light exposure process is first performed in accordance with a predetermined line width, and a second light exposure process is then performed with a different mask position in accordance with a smaller line width, so as to improve the resolution. However, the double light exposure technique literally comprises two light exposure processes, and thus doubles the time period necessary for the photolithography sequence by simple arithmetic. Accordingly, there is concern that the double light exposure technique significantly lowers the throughput in manufacturing semiconductor devices.

DISCLOSURE OF INVENTION

An object of the present invention is to provide a substrate processing system and substrate transfer method that can perform processes in a photolithography sequence with high throughput.

According to a first aspect of the present invention, there is provided a substrate processing system for performing a process including a photolithography sequence on target substrates, the substrate processing system comprising:

a first automated substrate transfer line configured to transfer the target substrates among a plurality of process sections for respectively performing processes on the target substrates;

a photolithography process section configured to perform a series of processes in the photolithography sequence and located relative to the first automated substrate transfer line so as for the target substrates to be transferred therebetween; and a second automated substrate transfer line configured to transfer the target substrates among respective process apparatuses in the photolithography process section.

In the first aspect, the second automated substrate transfer line is preferably a cyclical substrate transfer line independent of the first automated substrate transfer line. In this case, the substrate processing system preferably comprises:

a first automated substrate transfer unit configured to travel on the first automated substrate transfer line and to transfer the target substrates to and from the respective process sections; and a second automated substrate transfer unit configured to travel on the second automated substrate transfer line and to transfer the target substrates to and from the respective process apparatuses in the photolithography process section.

Each of the first automated substrate transfer unit and the second automated substrate transfer unit may be a container transfer unit configured to transfer a container with a plurality of target substrates stored therein. Alternatively, the first automated substrate transfer unit may be a container transfer unit configured to transfer a container with a plurality of target substrates stored therein, and the second automated substrate transfer unit may be a single-substrate transfer unit configured to transfer the target substrates one by one.

The substrate processing system preferably comprises:

a first control section configured to control transfer of the target substrates on the first automated substrate transfer line; and a second control section configured to control transfer of the target substrates on the second automated substrate transfer line.

The photolithography process section may comprise a resist coating process apparatus, a light exposure process apparatus, and a developing process apparatus. In this case, the photolithography process section may be arranged such that at least the resist coating process apparatus and the developing process apparatus are disposed separately from each other and each located relative to the second automated substrate transfer line so as for the target substrates to be transferred therebetween. Alternatively, the photolithography process section may be arranged such that the resist coating process apparatus, the light exposure process apparatus, and the developing process apparatus are disposed separately from each other and each located relative to the second automated substrate transfer line so as for the target substrates to be transferred therebetween. Alternatively, the photolithography process section may be arranged such that the resist coating process apparatus, the light exposure process apparatus, and the developing process apparatus respectively comprise substrate transfer ports through which the target substrates are transferred to and from the second automated substrate transfer line.

The number of resist coating process apparatuses and the number of light exposure process apparatuses disposed in the system are preferably set at a ratio of 1:2.

A post-light-exposure baking process apparatus is preferably disposed adjacent to the light exposure process apparatus.

The photolithography process section is preferably a process section configured to perform pattern formation by use of a double light exposure technique.

According to a second aspect of the present invention, there is provided a substrate transfer method for transferring target substrates in a substrate processing system for performing a process including a photolithography sequence on the target substrates, the substrate processing system comprising a first automated substrate transfer line configured to transfer the target substrates among a plurality of process sections for respectively performing processes on the target substrates, and a second automated substrate transfer line of a cyclical type dedicated to a photolithography process section, which is configured to perform a series of processes in the photolithography sequence, and located relative to the first automated substrate transfer line so as for the target substrates to be transferred therebetween, and the substrate transfer method comprising: transferring the target substrates among the respective process apparatuses in the photolithography process section by use of the second automated substrate transfer line.

In the second aspect, the photolithography process section is preferably arranged such that at least the resist coating process apparatus and the developing process apparatus are disposed separately from each other and each located relative to the second automated substrate transfer line so as for the target substrates to be transferred therebetween, and the substrate transfer method preferably comprises: selecting transfer destinations of the target substrates from the second automated substrate transfer line in accordance with operational status of the respective process apparatuses.

The substrate transfer method may comprise: transferring a container with a plurality of target substrates stored therein on the first automated substrate transfer line and the second automated substrate transfer line; and transferring the container with the target substrates stored therein between the second automated substrate transfer line and the respective process apparatuses in the photolithography process section.

The substrate transfer method may comprise: transferring a container with a plurality of target substrates stored therein on the first automated substrate transfer line; transferring the target substrates one by one on the second automated substrate transfer line; and transferring the target substrates one by one between the second automated substrate transfer line and the respective process apparatuses in the photolithography process section.

According to a third aspect of the present invention, there is provided a control program for execution on a computer, wherein, when executed, the control program controls the substrate processing system to conduct the substrate transfer method according to the second aspect.

According to a fourth aspect of the present invention, there is provided a computer readable storage medium that stores a control program for execution on a computer, wherein, when executed, the control program controls the substrate processing system to conduct the substrate transfer method according to the second aspect.

BEST MODE FOR CARRYING OUT THE INVENTION

Figure 1:
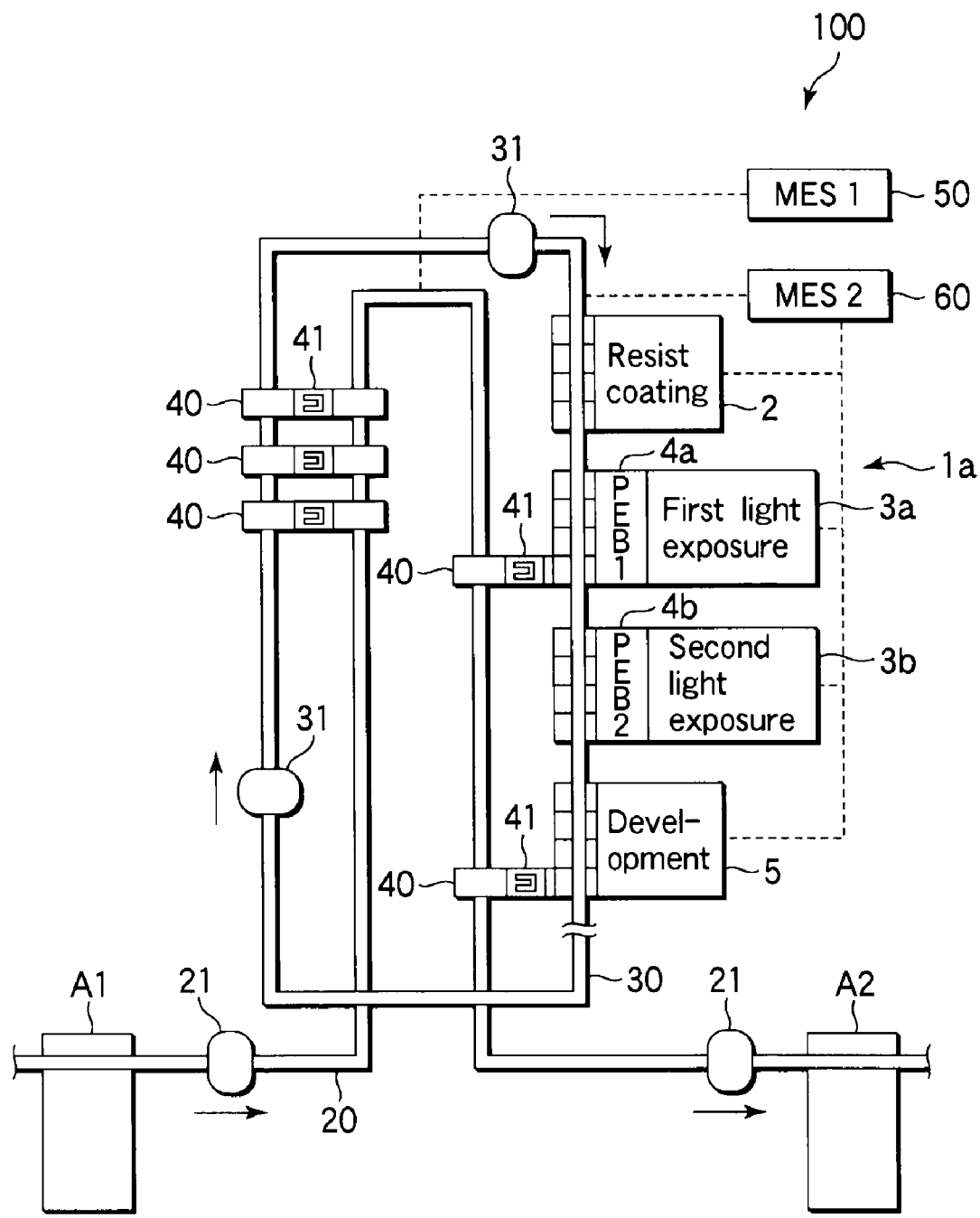
FIG. 1 is a view showing the apparatus layout of a photolithography process section used in a substrate processing system according to a first embodiment.

In the process of developing the present invention, the inventors studied problems with regard to conventional substrate processing systems for performing a process including a photolithography sequence on target substrates, such as semiconductor wafers. As a result, the inventors have arrived at the findings given below.

Specifically, as described above, in order to improve the productivity in manufacturing semiconductor devices, which are being miniaturized, it will become more important to improve the throughput of photolithography sequences in the future. Specifically, for example, where the double light exposure technique is adopted, it is estimated that photolithography sequences are required to provide a process performance almost doubled from its current value of 100 to 150 wafers per hour to a value of 200 to 300 wafers per hour, in order to maintain the current productivity level.

However, if the number of wafers to be processed in one resist coating/developing process apparatus is increased to improve the productivity of photolithography sequences, the reliability thereof may be deteriorated due to troubles, such as malfunctions of the apparatus. If a malfunction of an apparatus is caused during a double light exposure process, the productivity thereof is significantly adversely affected. Particularly, according to the apparatus layout of conventional photolithography process sections, a resist coating/developing process apparatus and a light exposure process apparatus are disposed adjacent to each other as one set. In this case, if the resist coating/developing process apparatus causes a malfunction, the light exposure process apparatus, which is expensive, needs to be also stopped, and the production cost is thereby significantly increased.

Further, according to the conventional apparatus layout, until a series of processes, such as resist coating, light exposure, and development, are finished for all the wafers in one cassette transferred to the resist coating/developing process apparatus, no processes can be performed for a subsequent cassette. For this reason, the AMHS needs to be provided with stocker means (buffer), and so the AMHS may take on an increased burden while it may involve an increased number of lots in process. According to the conventional resist coating/developing process apparatus, this problem may be solved by increasing the number of resist coating process units (COT) and developing process units (DEV) disposed therein to enhance the process performance. However, this method enlarges the size of the apparatus and requires a larger installation space.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

First Embodiment

FIG. 1 is a view schematically showing a substrate processing system 100 according to a first embodiment of the present invention, while focusing on the transfer function around a photolithography process section 1a for performing a photolithography sequence. This substrate processing system 100 includes a first automated substrate transfer line or main transfer line 20 arranged to transfer wafers W over the entire system and to transfer wafers W to and from process sections (for example, process sections A1 and A2), and a second automated substrate transfer line or auxiliary transfer line 30 arranged to transfer wafers W inside the photolithography process section 1a.

The main transfer line 20 is structured as an AMHS (Automated Material Handling Systems) and includes, e.g., a plurality of OHTs (Overhead Hoist Transport) 21. Each of the OHTs 21 is configured to travel on the main transfer line 20 with a cassette (not shown) that stores wafers W, so as to transfer wafers W to and from the photolithography process section 1a and the respective process sections (for example, process sections A1 and A2).

The auxiliary transfer line 30 is structured as an AMHS independent of the main transfer line 20 and includes OHTs 31. Each of the OHTs 31 is configured to be circulated or travel around on the auxiliary transfer line 30 of the cyclical type having a loop shape, so as to transfer wafers W to and from the respective apparatuses in the photolithography process section 1a and to transfer wafers W among the respective process apparatuses. Although not shown, the OHTs 31 are configured to travel on a track at a position higher than that of the OHTs 21.

The photolithography process section 1a includes a resist coating process apparatus 2 for coating the surface of a wafer W with a predetermined resist; a first light exposure process apparatus 3a for performing a light exposure process on a wafer W coated with a resist; a first PEB process apparatus 4a for performing a heat process on a resist after a light exposure process; a second light exposure process apparatus 3b for performing a light exposure process on a wafer W; a second PEB process apparatus 4b for performing a heat process on a resist after a light exposure process; and a developing process apparatus 5 for performing development on a wafer W after a light exposure process. In this way, the photolithography process section 1a adopts an apparatus layout suitable for a double light exposure process which repeats a light exposure process twice on a wafer W to form a fine pattern. In the photolithography process section 1a, the resist coating process apparatus 2, first light exposure process apparatus 3a, second light exposure process apparatus 3b, and developing process apparatus 5 are disposed separately from each other, while the first PEB process apparatus 4a is present adjacent to the first light exposure process apparatus 3a, and the second PEB process apparatus 4b is present adjacent to the second light exposure process apparatus 3b. Wafers W are transferred between the first light exposure process apparatus 3a and the OHTs 31 on the auxiliary transfer line 30 through the first PEB process apparatus 4a adjacent to the first light exposure process apparatus 3a. Similarly, wafers W are transferred between the second light exposure process apparatus 3b and the OHTs 31 on the auxiliary transfer line 30 through the second PEB process apparatus 4b adjacent to the second light exposure process apparatus 3b.

Although not shown in FIG. 1, the photolithography process section 1a includes a plurality of groups, each of which is formed of the resist coating process apparatus 2, first and second light exposure process apparatuses 3a and 3b, first and second PEB process apparatuses 4a and 4b, and developing process apparatus 5. Accordingly, the total number of process apparatuses of each type is expressed by an integer obtained as a product of multiplication by the number of groups while the ratio of the process apparatuses included in each group is maintained.

In the substrate processing system 100 according to this embodiment, each wafer W coated with a resist in the resist coating process apparatus 2 can be transferred to either one of the first light exposure process apparatus 3a and second light exposure process apparatus 3b. Specifically, each wafer W is transferred to one of the first light exposure process apparatus 3a and second light exposure process apparatus 3b, which has a larger margin of processing power, or which is selected as an unoccupied light exposure process apparatus.

Figure 2:
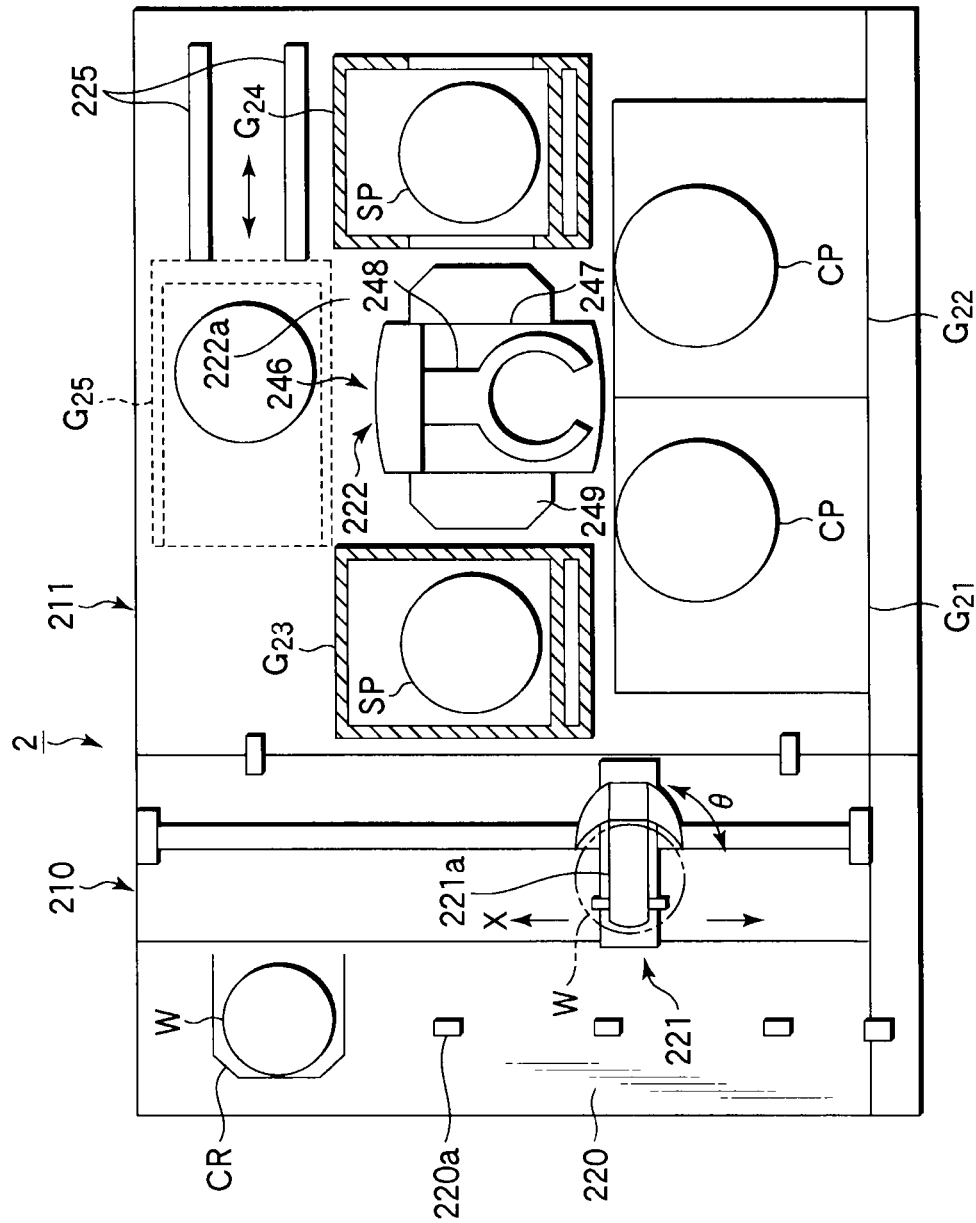
FIG. 2 is a plan view showing a resist coating process apparatus.
Figure 3:
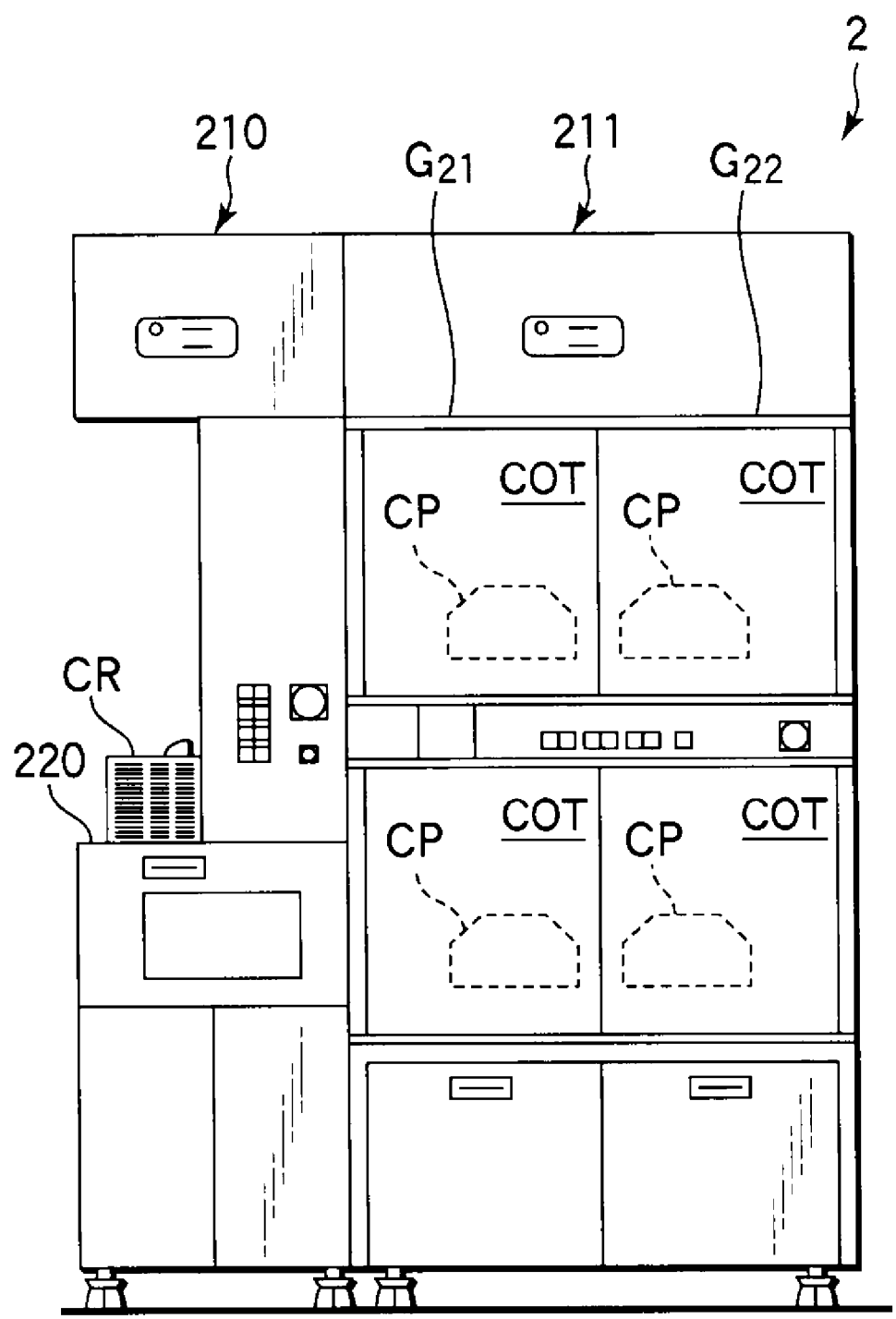
FIG. 3 is a front view of the resist coating process apparatus shown in FIG. 2.
Figure 4:
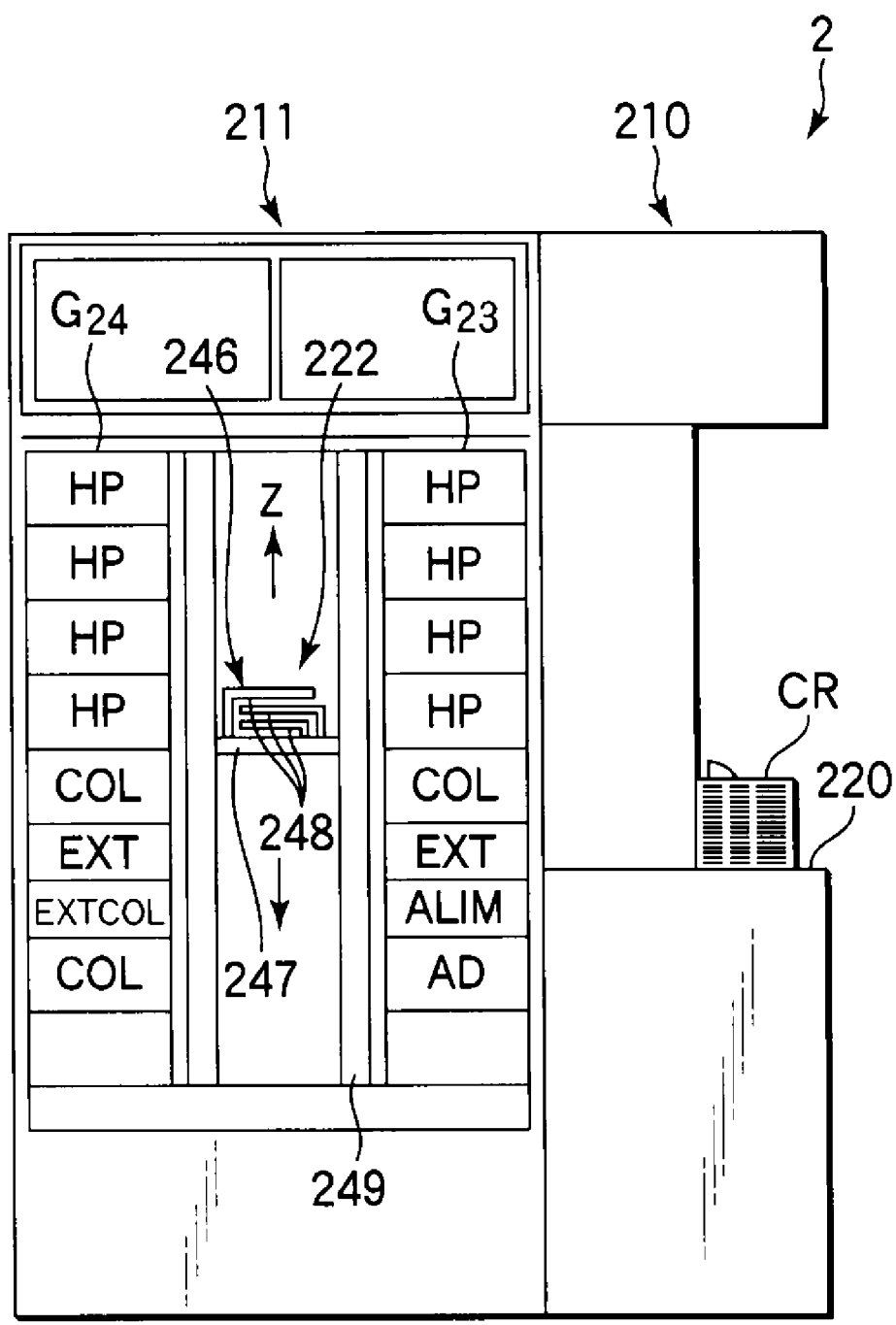
FIG. 4 is a back view of the resist coating process apparatus shown in FIG. 2.

For example, the resist coating process apparatus 2 has a structure as shown in FIGS. 2 to 4. FIG. 2 is a plan view schematically showing the resist coating process apparatus 2. FIG. 3 is a front view of the resist coating process apparatus 2. FIG. 4 is a back view of the resist coating process apparatus 2. The resist coating process apparatus 2 includes a cassette station 210 serving as a transfer station, and a process station 211 including a plurality of process units.

The cassette station 210 is used as a transfer port through which cassettes CR each storing a plurality of, such as 25, target objects or wafers W are loaded from the auxiliary transfer line 30 to the resist coating process apparatus 2, and unloaded from the resist coating process apparatus 2 to the auxiliary transfer line 30. The cassette station 210 is also used to transfer wafers W between the wafer cassettes CR and process station 211.

As shown in FIG. 2, the cassette station 210 includes a cassette table 220 having a plurality of (four in FIG. 2) positioning protrusions 220a arrayed in an X-direction in FIG. 2. The wafer cassettes CR can be placed in a row respectively at the positions of the protrusions 220a while their wafer transfer ports face the process station 211. Each of the wafer cassettes CR stores wafers W such that they are arrayed in the vertical direction (Z-direction). Further, the cassette station 210 includes a wafer transfer mechanism 221 disposed between the cassette table 220 and process station 211.

The wafer transfer mechanism 221 includes a wafer transfer arm 221a movable in the cassette array direction (X-direction) and in the wafer W array direction (Z-direction) stored in each cassette, so that the wafer transfer arm 221a can selectively access the respective wafer cassettes CR. Further, the wafer transfer arm 221a is rotatable in a θ-direction shown in FIG. 2, so that the wafer transfer arm 221a can also access an alignment unit (ALIM) and extension unit (EXT) disposed in the third processing group $G_{23}$ of the process station 211, as described later.

On the other hand, the process station 211 includes a plurality of process units for performing a series of steps for subjecting wafers W to a coating process. The process units are stacked one on top of the other at predetermined positions and each of the process units is configured to process wafers W one by one. As shown in FIG. 2, the process station 211 has a wafer transfer passage 222a at the center, in which a main wafer transfer mechanism 222 is disposed, while all the process units are set up around the wafer transfer passage 222a. The process units are divided to belong to a plurality of processing groups, each of which includes a plurality of process units stacked one on top of the other in the vertical direction (Z-direction).

As shown in FIG. 4, the main wafer transfer mechanism 222 includes a wafer transfer unit 246 disposed inside a cylindrical support 249 and configured to be moved up and down in the vertical direction (Z-direction). The cylindrical support 249 is rotatable integrally with the wafer transfer unit 246 by a rotational driving force given from a motor (not shown). The wafer transfer unit 246 includes a transfer base 247 and a plurality of holding members 248 movable back and forth on the transfer base 247. The holding members 248 are used to transfer wafers W between the process units.

As shown in FIG. 2, in the resist coating process apparatus 2, five processing groups $G_{21}$, $G_{22}$, $G_{23}$, $G_{24}$, and $G_{25}$ are disposed around the wafer transfer passage 222a. Of them, the first and second processing groups $G_{21}$ and $G_{22}$ are disposed side by side on the front side of the resist coating process apparatus 2. The third processing group $G_{23}$ is disposed adjacent to the cassette station 210. The fourth processing group $G_{24}$ is disposed opposite to the third processing group $G_{23}$ with the wafer transfer passage 222a interposed therebetween. The fifth processing group $G_{25}$ is disposed on the rear side.

The first processing group $G_{21}$ includes two resist coating process units (COT) stacked one on top of the other, each formed of a process unit of the spinner type, in which a predetermined process is performed on a wafer W placed on a spin chuck (not shown) inside a coater cup (CP). Similarly, the second processing group $G_{22}$ includes two resist coating process units (COT) stacked one on top of the other, each formed of a process unit of the spinner type.

As shown in FIG. 4, the third processing group $G_{23}$ includes a plurality of process units stacked one on top of the other, each formed of a process unit of the oven type, in which a predetermined process is performed on a wafer W placed on a worktable SP. Specifically, eight process units are stacked in the following order from below: an adhesion unit (AD) for performing a so-called hydrophobic process to improve resist fixation; an alignment unit (ALIM) for performing alignment; an extension unit (EXT) for loading/unloading wafers W; a cooling unit (COL) for performing a cooling process; and four hot plate units (HP) for performing a heat process on a wafer W before the light exposure process. In place of the alignment unit (ALIM), a cooling unit (COL) with an alignment function may be disposed.

The fourth processing group $G_{24}$ also includes a plurality of process units of the oven type stacked one on top of the other. Specifically, eight process units are stacked in the following order from below: a cooling unit (COL); an extension and cooling unit (EXTCOL) having a cooling plate and configured as a wafer loading/unloading portion; an extension unit (EXT); a cooling unit (COL); and four hot plate units (HP).

Where the fifth processing group $G_{25}$ is disposed on the rear side of the main wafer transfer mechanism 222, the fifth processing group $G_{25}$ is arranged to be movable laterally relative to the main wafer transfer mechanism 222 along a guide rail 225.

Figure 5:
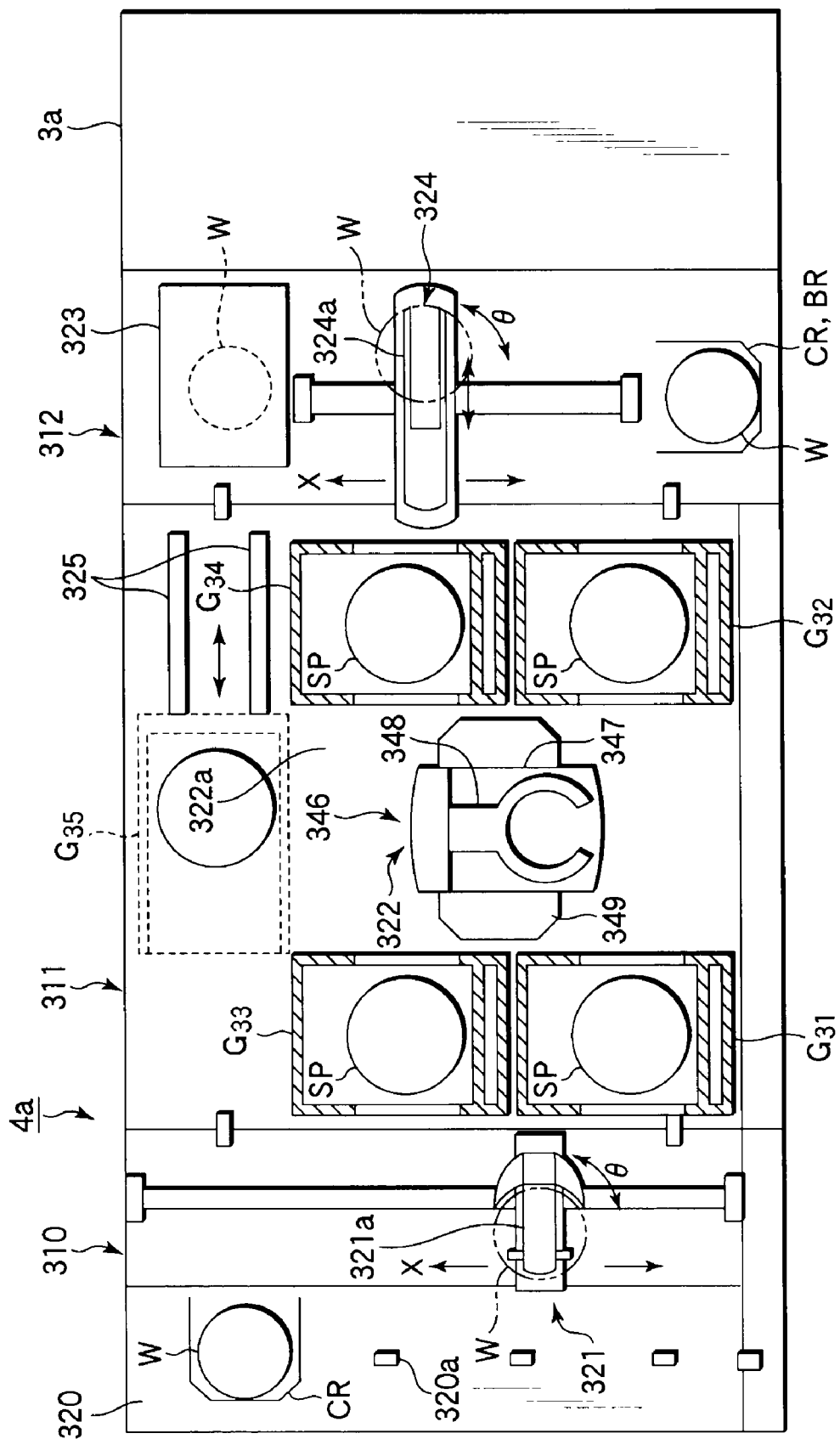
FIG. 5 is a plan view showing a PEB process apparatus.
Figure 6:
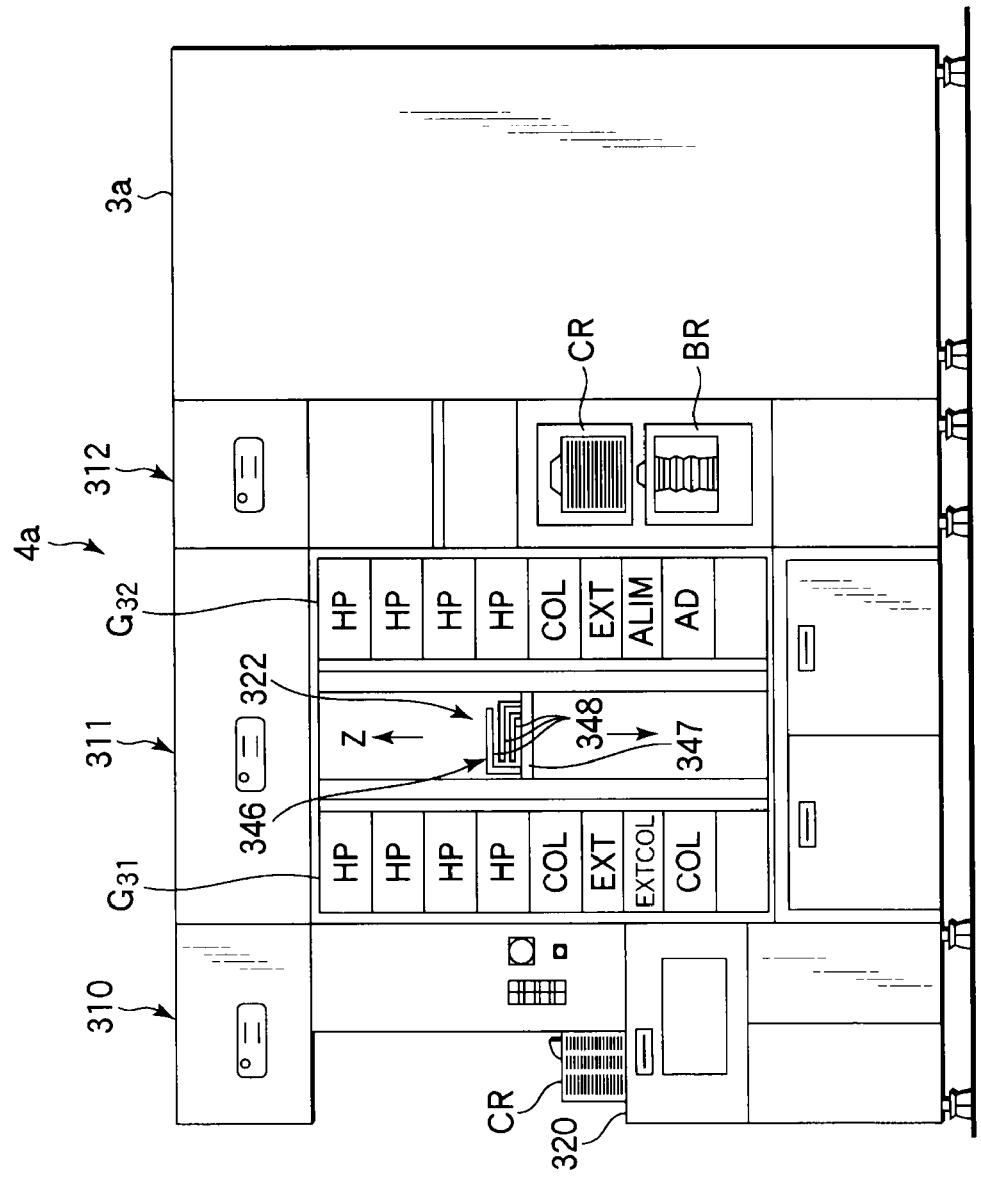
FIG. 6 is a front view of the PEB process apparatus shown in FIG. 5.
Figure 7:
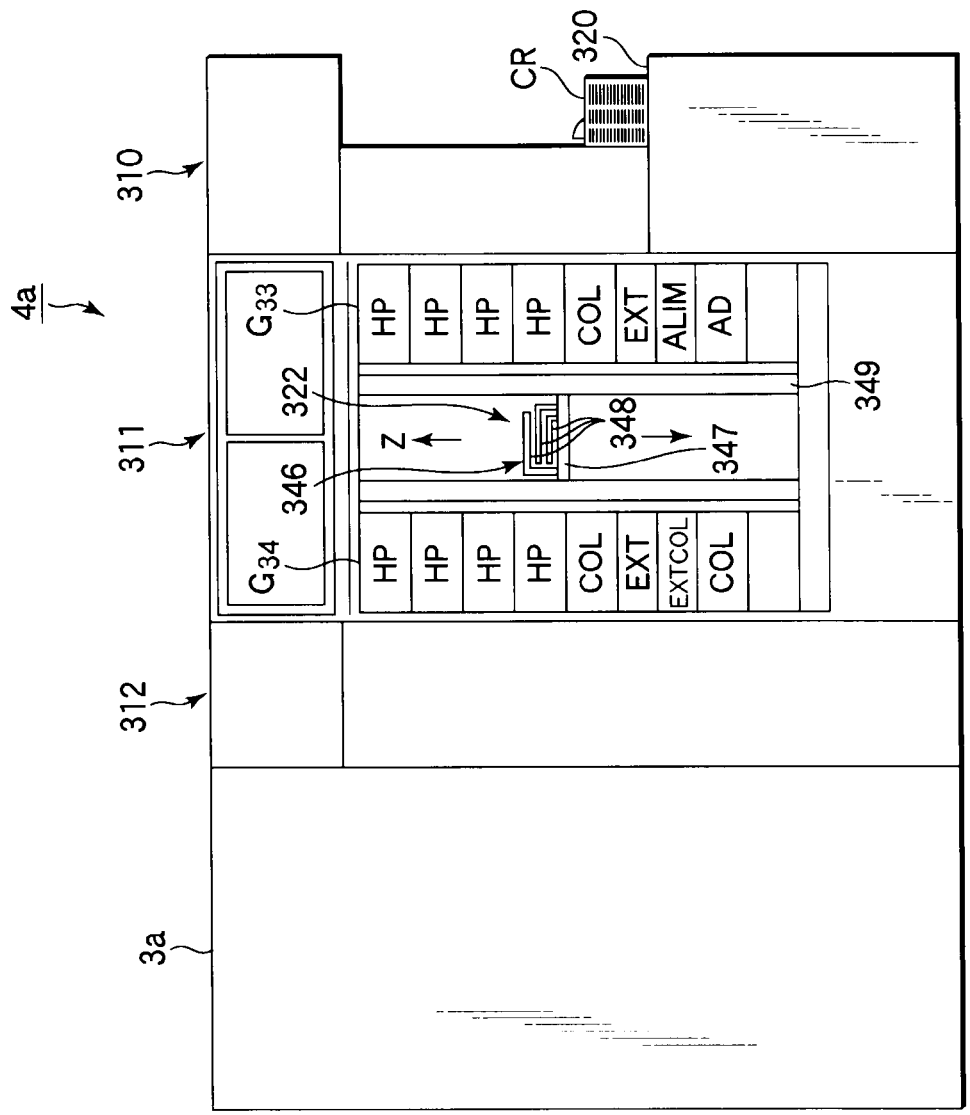
FIG. 7 is a back view of the PEB process apparatus shown in FIG. 5.

For example, the first PEB process apparatus 4a disposed adjacent to the first light exposure process apparatus 3a has a structure as shown in FIGS. 5 to 7. Since the second PEB process apparatus 4b has the same structure as that of the first PEB process apparatus 4a, only the first PEB process apparatus 4a will be explained as a representative, without explanation on the second PEB process apparatus 4b.

FIG. 5 is a plan view schematically showing the first PEB process apparatus 4a. FIG. 6 is a front view of the first PEB process apparatus 4a. FIG. 7 is a back view of the first PEB process apparatus 4a. The first PEB process apparatus 4a includes a cassette station 310 serving as a transfer station, a process station 311 including a plurality of process units, and an interface station 312 configured to transfer wafers W to and from the light exposure process apparatus (not shown) disposed adjacent to the process station 311.

The cassette station 310 is used as a transfer port through which cassettes CR each storing a plurality of, such as 25, target objects or wafers W are loaded from the auxiliary transfer line 30 to the first PEB process apparatus 4a, and unloaded from the first PEB process apparatus 4a to the auxiliary transfer line 30. The cassette station 310 is also used to transfer wafers W between the wafer cassettes CR and process station 311.

As shown in FIG. 5, the cassette station 310 includes a cassette table 320 having a plurality of (four in FIG. 5) positioning protrusions 320a arrayed in an X-direction in FIG. 5. The wafer cassettes CR can be placed in a row respectively at the positions of the protrusions 320a while their wafer transfer ports face the process station 311. Each of the wafer cassettes CR stores wafers W such that they are arrayed in the vertical direction (Z-direction). Further, the cassette station 310 includes a wafer transfer mechanism 321 disposed between the cassette table 320 and process station 311.

The wafer transfer mechanism 321 includes a wafer transfer arm 321a movable in the cassette array direction (X-direction) and in the wafer W array direction (Z-direction) stored in each cassette, so that the wafer transfer arm 321a can selectively access the respective wafer cassettes CR. Further, the wafer transfer arm 321a is rotatable in a θ-direction shown in FIG. 5, so that the wafer transfer arm 321a can also access an alignment unit (ALIM) and extension unit (EXT) disposed in the third processing group $G_{33}$ of the process station 311, as described later.

On the other hand, the process station 311 includes a plurality of process units for performing a series of steps for subjecting wafers W to a PEB process. The process units are stacked one on top of the other at predetermined positions and each of the process units is configured to process wafers W one by one. As shown in FIG. 5, the process station 311 has a wafer transfer passage 322a at the center, in which a main wafer transfer mechanism 322 is disposed, while all the process units are set up around the wafer transfer passage 322a. The process units are divided to belong to a plurality of processing groups, each of which includes a plurality of process units stacked one on top of the other in the vertical direction (Z-direction).

As shown in FIG. 7, the main wafer transfer mechanism 322 includes a wafer transfer unit 346 disposed inside a cylindrical support 349 and configured to be moved up and down in the vertical direction (Z-direction). The cylindrical support 349 is rotatable integrally with the wafer transfer unit 346 by a rotational driving force given from a motor (not shown). The wafer transfer unit 346 includes a transfer base 347 and a plurality of holding members 348 movable back and forth on the transfer base 347. The holding members 348 are used to transfer wafers W between the process units.

As shown in FIG. 5, in the first PEB process apparatus 4a, five processing groups $G_{31}$, $G_{32}$, $G_{33}$, $G_{34}$, and $G_{35}$ are disposed around the wafer transfer passage 322a. Of them, the first and second processing groups $G_{31}$ and $G_{32}$ are disposed side by side on the front side of the first PEB process apparatus 4a. The third processing group $G_{33}$ is disposed adjacent to the cassette station 310. The fourth processing group $G_{34}$ is disposed adjacent to the interface station 312. The fifth processing group $G_{35}$ is disposed on the rear side.

As shown in FIGS. 6 and 7, each of the first processing group $G_{31}$ and fourth processing group $G_{34}$ includes a plurality of process units stacked one on top of the other, each formed of a process unit of the oven type, in which a predetermined process is performed on a wafer W placed on a worktable SP. Specifically, eight process units are stacked in the following order from below: a cooling unit (COL); an extension and cooling unit (EXTCOL) having a cooling plate and configured as a wafer loading/unloading portion; an extension unit (EXT); a cooling unit (COL); and four hot plate units (HP).

As shown in FIGS. 6 and 7, each of the second processing group $G_{32}$ and third processing group $G_{33}$ includes a plurality of process units stacked one on top of the other, each formed of a process unit of the oven type, in which a predetermined process is performed on a wafer W placed on a worktable SP. Specifically, eight process units are stacked in the following order from below: an adhesion unit (AD) for performing a so-called hydrophobic process to improve resist fixation; an alignment unit (ALIM) for performing alignment; an extension unit (EXT) for loading/unloading wafers W; a cooling unit (COL) for performing a cooling process; and four hot plate units (HP) for performing a heat process on a wafer W after the light exposure process. In place of the alignment unit (ALIM), a cooling unit (COL) with an alignment function may be disposed.

Where the fifth processing group $G_{35}$ is disposed on the rear side of the main wafer transfer mechanism 322, the fifth processing group $G_{35}$ is arranged to be movable laterally relative to the main wafer transfer mechanism 322 along a guide rail 325.

The interface station 312 has the same length as the process station 311 in the depth direction (X-direction). As shown in FIGS. 5 and 6, the interface section 312 includes a buffer cassette BR of the stationary type and a pickup cassette CR of the portable type stacked one on top of the other in two levels on the front side. The interface section 312 further includes a periphery light exposure process unit 323 disposed on the rear side, and a wafer transfer mechanism 324 disposed at the center. The wafer transfer mechanism 324 includes a wafer transfer arm 324a, which is movable in the X-direction and Z-direction, so that it can access the two cassettes CR and BR and periphery light exposure process unit 323.

The wafer transfer arm 324a is rotatable in a θ-direction, so that it can also access the extension unit (EXT) disposed in the fourth processing group $G_{34}$ of the process station 311 and a wafer transit table (not shown) of the light exposure process apparatus 3a adjacent thereto.

Figure 8:
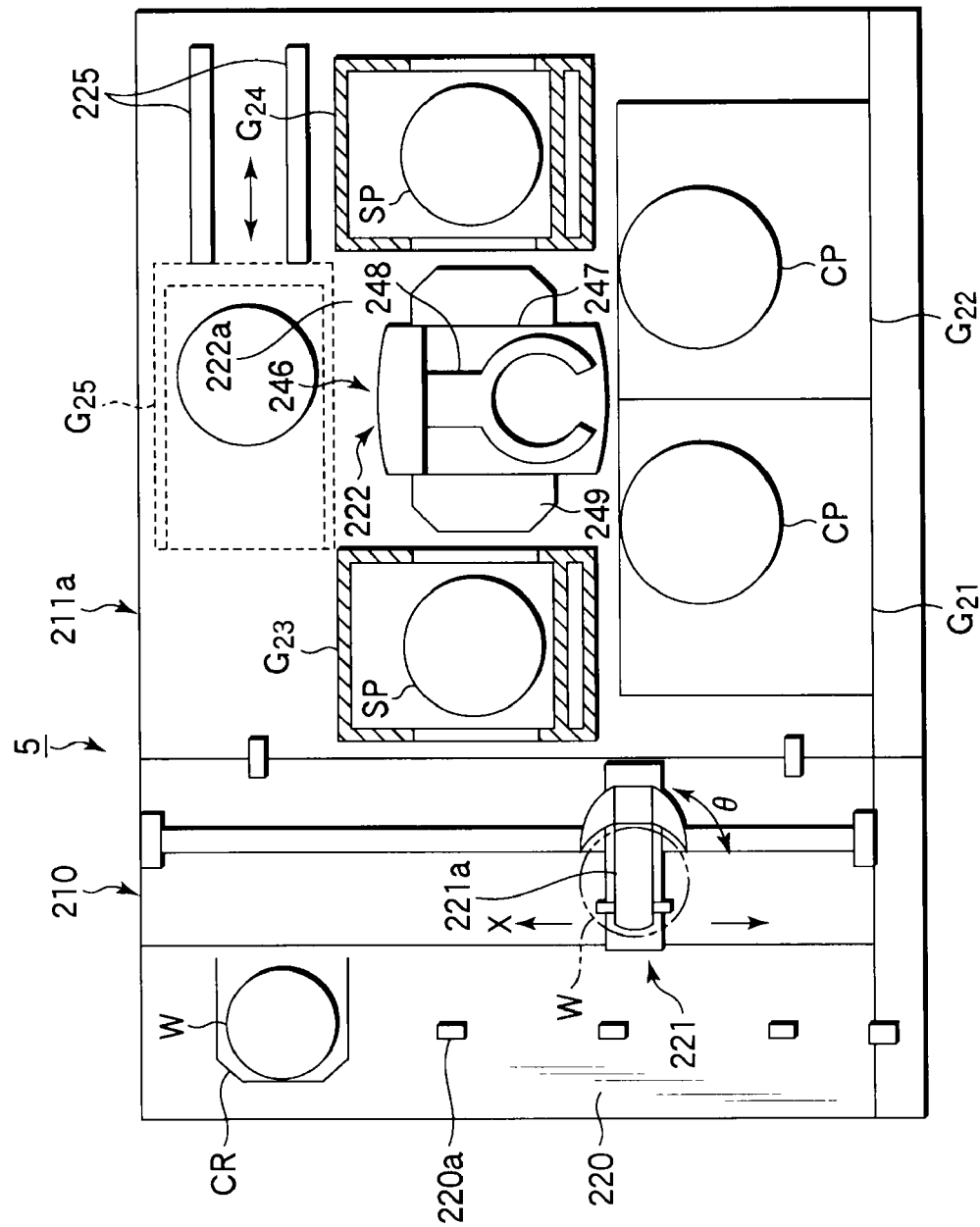
FIG. 8 is a plan view showing a developing process apparatus.
Figure 9:
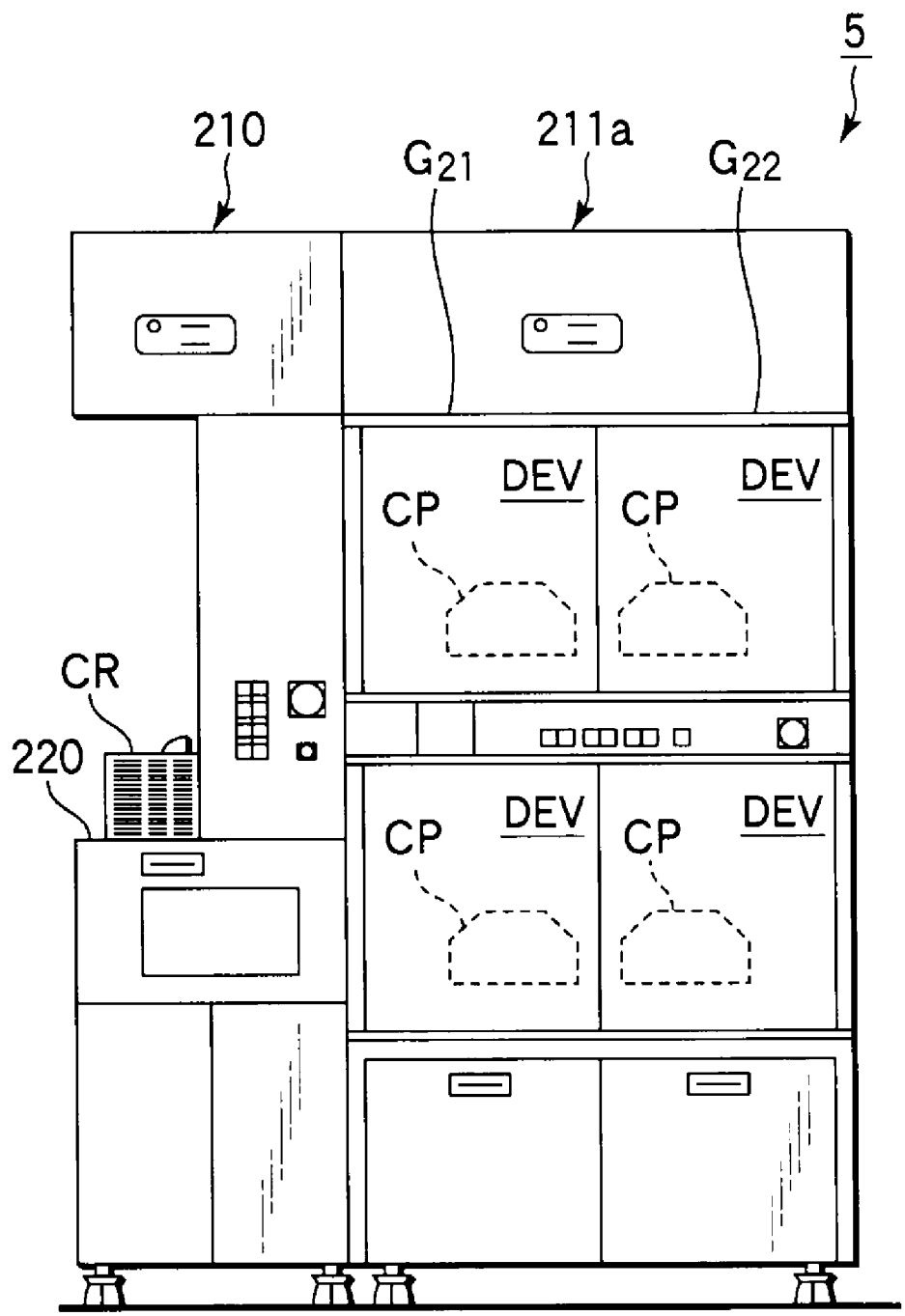
FIG. 9 is a front view of the developing process apparatus shown in FIG. 8.
Figure 10:
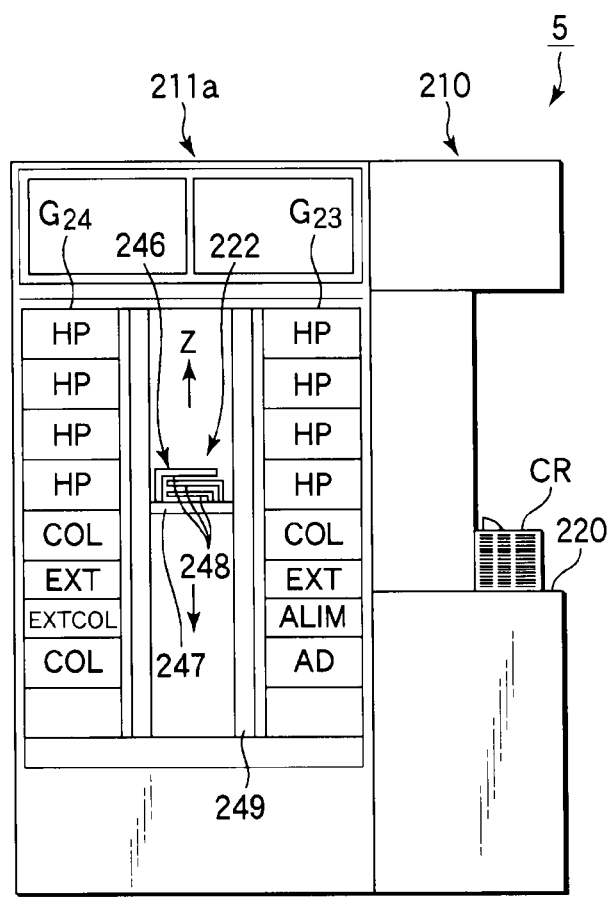
FIG. 10 is a back view of the developing process apparatus shown in FIG. 8.

For example, the developing process apparatus 5 has a structure as shown in FIGS. 8 to 10. FIG. 8 is a plan view schematically showing the developing process apparatus 5. FIG. 9 is a front view of the developing process apparatus 5. FIG. 10 is a back view of the developing process apparatus 5.

The developing process apparatus 5 has the same structure as that of the resist coating process apparatus 2 shown in FIGS. 2 to 4 except that two development units (DEV) for performing development of a resist pattern are stacked one on top of the other in each of the first processing group $G_{21}$ and second processing group $G_{22}$ of the process station 211a in place of the resist coating process units (COT) in the process station 211 of the resist coating process apparatus 2.

Referring back to FIG. 1 again, the OHTs 21 on the main transfer line 20 and the OHTs 31 on the auxiliary transfer line 30 are arranged to transfer wafers W between them at a plurality of wafer transit areas 40 each including a wafer handling robot 41.

The main transfer line 20 is connected to a first manufacturing execution system (MES) 50 serving as an overall control section for administrating the substrate processing system 100 as a whole. The first MES 50 is preset to cooperate with control sections (for example, an MES 60 described later) respectively disposed in the process sections and transfer devices, so that it can feed real time information concerning process steps in the factory back to the basic affair system (not shown) and can make judgment for process steps in light of the load and so forth in the factory as a whole. Specifically, the first MES 50 can optimize transfer conditions by controlling the OHTs 21 in traveling, stoppage, standby, and transfer of wafers W among process sections (for example, process sections A1 and A2), while checking the load of the respective OHTs 21 on the main transfer line 20, for example.

The auxiliary transfer line 30 is connected to a second manufacturing execution system (MES) 60. The second MES 60 serves for the photolithography process section 1a as its own control section, and can control transfer conditions on the auxiliary transfer line 30 inside the photolithography process section 1a, and process conditions in the respective process apparatuses, such as the resist coating process apparatus 2, first and second light exposure process apparatuses 3a and 3b, first and second PEB process apparatuses 4a and 4b, and developing process apparatus 5. More specifically, the second MES 60 can optimize transfer conditions by controlling the OHTs 31 in traveling, stoppage, standby, and transfer of wafers W among process apparatuses, while checking the load of the respective OHTs 31 on the auxiliary transfer line 30, for example.

Figure 11:
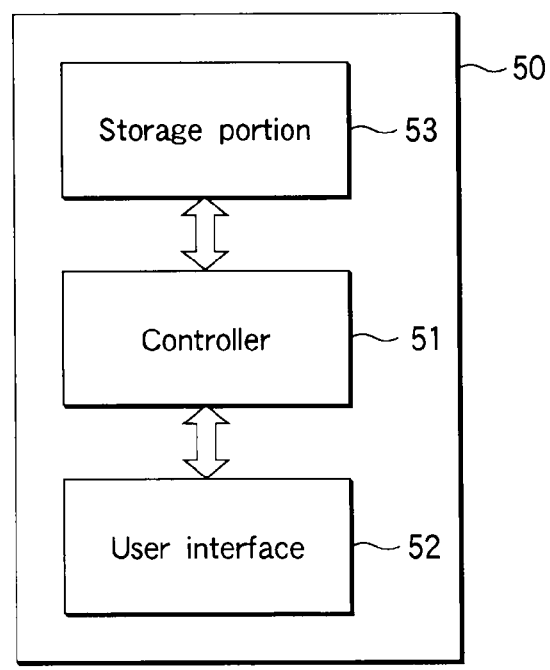
FIG. 11 is a block diagram showing a first MES.

FIG. 11 is a block diagram showing the first MES 50. The first MES 50 includes a controller 51 comprising a host computer, a user interface 52, and a storage portion 53. The user interface 52 connected to the controller 51 includes, e.g. a keyboard and a display, wherein the keyboard is used for a process operator to input commands for operating the substrate processing system 100, and the display is used for showing visualized images of the operational status of the substrate processing system 100. The storage portion 53 connected to the controller 51 stores recipes containing control programs (software), transfer condition data, process condition data, and so forth recorded therein, for the controller 51 to control the substrate processing system 100 so as to perform wafer transfer and various processes.

A required recipe is retrieved from the storage portion 53 and executed by the controller 51 in accordance with an instruction or the like input through the user interface 52. Consequently, the substrate processing system 100 can perform a predetermined process under the control of the controller 51. The recipes containing control programs and process condition data may be used while they are stored in a computer readable storage medium, such as a CD-ROM, hard disk, flexible disk, or flash memory. Alternatively, the recipes may be used online while they are transmitted from another apparatus through, e.g., a dedicated line, as needed.

The second MES 60 has the same basic structure as the first MES except that the control target is limited to the photolithography process section 1a. Hence, no explanation or illustration is given thereof.

In the substrate processing system 100 having the structure described above, for example, wafers W transferred from another process section (not shown) by an OHT 21 on the main transfer line 20 are transferred at one of the wafer transit areas 40 by the corresponding wafer handling robot 41 onto an OHT 31 on the auxiliary transfer line 30 of the photolithography process section 1a. Then, the wafers are transferred by the OHTs 31 on the auxiliary transfer line 30 among the respective process apparatuses inside the photolithography process section 1a.

In the resist coating process apparatus 2 described above, at first, the wafer transfer arm 221a of the wafer transfer mechanism 221 accesses a wafer cassette CR that stores unprocessed wafers W on the cassette table 220 in the cassette station 210. Then, the wafers W are taken out one by one by the wafer transfer arm 221a, and each wafer W thus taken out is transferred to the extension unit (EXT) of the third processing group $G_{23}$.

Then, the wafer W is transferred by the wafer transfer unit 246 of the main wafer transfer mechanism 222 from this extension unit (EXT) into the process station 211. Then, the wafer W is subjected to alignment in the alignment unit (ALIM) of the third processing group $G_{23}$, and is then transferred to the adhesion process unit (AD) and subjected to the hydrophobic process (HMDS process) therein to improve resist fixation. Since this process entails heat, the wafer W is then transferred by the wafer transfer unit 246 to the cooling unit (COL) and subjected to cooling therein.

The wafer W processed in the adhesion process unit (AD) and cooled in the cooling unit (COL), or a wafer W not supposed to be processed in the adhesion process unit (AD), is further transferred by the wafer transfer unit 246 to the resist coating process unit (COT), in which a resist is applied onto the wafer W to form a coating film. After the coating process is finished, the wafer W is subjected to a pre-baking process in one of the hot plate units (HP) and is cooled in one of the cooling units (COL) in the third and fourth processing groups $G_{23}$ and $G_{24}$.

The wafer W thus cooled is transferred to the alignment unit (ALIM) of the third processing group $G_{23}$, and is then returned through the extension unit (EXT) of the third processing group $G_{23}$ to the cassette station 210. Then, the wafer W is inserted in one of the wafer cassettes CR.

After the wafers W are coated with the resist in the resist coating process apparatus 2, the wafers W are returned through the cassette station 210 onto an OHT 31 on the auxiliary transfer line 30. Then, the wafers W are transferred by the OHT 31 to the cassette station 310 of the PEB process apparatus 4a and are loaded into the PEB process apparatus 4a. In the PEB process apparatus 4a, at first, the wafer transfer arm 321a of the wafer transfer mechanism 321 accesses a wafer cassette CR that stores the wafers W coated with the resist on the cassette table 320 in the cassette station 310. Then, the wafers W are taken out one by one by the wafer transfer arm 321a, and each wafer W thus taken out is transferred to the extension unit (EXT) of the third processing group $G_{33}$.

Then, the wafer W is transferred by the wafer transfer unit 346 of the main wafer transfer mechanism 322 from this extension unit (EXT) into the process station 311. Then, the wafer W is subjected to alignment in the alignment unit (ALIM) of the third processing group $G_{33}$, and is then transferred through the extension unit (EXT) of the fourth processing group $G_{34}$ to the interface station 312.

In the interface station 312, the wafer W is subjected to periphery light exposure in the periphery light exposure process unit 323 to remove superfluous part of the resist. Then, the wafer W is transferred to the first light exposure process apparatus 3a disposed adjacent to the interface station 312, in which a light exposure process is performed on the resist film of the wafer W in accordance with a predetermined pattern. After the light exposure, the wafer W is returned to the interface station 312 of the first PEB process apparatus 4a, and is transferred by the wafer transfer mechanism 324 to the extension unit (EXT) of the fourth processing group $G_{34}$. Then, the wafer W is transferred by the wafer transfer unit 346 to one of the hot plate units (HP) and subjected to the PEB process therein, and then is cooled by one of the cooling units (COL). According to this embodiment, since the PEB process apparatus (4a or 4b) is disposed adjacent to the light exposure process apparatus (3a or 3b), the time management from the light exposure process to the PEB process can be accurately performed. Then, the wafer W is returned through the extension unit (EXT) of the third processing group $G_{33}$ to the cassette station 310, and is inserted into one of the wafer cassettes CR.

After wafers W are subjected to the light exposure in the first light exposure process apparatus 3a, the wafers W are returned through the cassette station 310 of the first PEB process apparatus 4a onto an OHT 31 on the auxiliary transfer line 30. Then, the wafers W are transferred by the OHT 31 to the cassette station 310 of the second PEB process apparatus 4b and are loaded into the second PEB process apparatus 4b. Then, the wafers W are subjected to the second-round light exposure process and the second-round PEB process in the second light exposure process apparatus 3b and second PEB process apparatus 4b by use of the same sequence as that explained with reference to the first PEB process apparatus 4a and first light exposure process apparatus 3a. After the wafers W are subjected to these two light exposure processes, the wafers W are returned through the cassette station 310 of the second PEB process apparatus 4b onto an OHT 31 on the auxiliary transfer line 30.

Then, the wafers W are transferred by the OHT 31 to the cassette station 210 of the developing process apparatus 5 and are loaded into the developing process apparatus 5. In the developing process apparatus 5, at first, the wafer transfer arm 221a of the wafer transfer mechanism 221 accesses a wafer cassette CR that stores the wafers W subjected to the double light exposure on the cassette table 220 in the cassette station 210. Then, the wafers W are taken out one by one by the wafer transfer arm 221a, and each wafer W thus taken out is transferred to the extension unit (EXT) of the third processing group $G_{23}$.

Then, the wafer W is transferred by the wafer transfer unit 246 of the main wafer transfer mechanism 222 from this extension unit (EXT) into the process station 211a. Then, the wafer W is subjected to alignment in the alignment unit (ALIM) of the third processing group $G_{23}$, and is then transferred to the development unit (DEV), in which development of the light-exposed pattern is performed. After the development is finished, the wafer W is transferred to one of the hot plate units (HP) and subjected to the PEB process therein, and is cooled in one of the cooling units (COL). After the series of processes described above is finish, the wafer W is returned through the extension unit (EXT) of the third processing group $G_{23}$ to the cassette station 210, and is inserted into one of the wafer cassettes CR. After the wafers W are subjected to the developing process, the wafers W are returned through the cassette station 210 of the developing process apparatus 5 onto an OHT 31 on the auxiliary transfer line 30. Thereafter, the wafers W having the predetermined pattern formed by the series of processes in the photolithography process section 1a are transferred at one of the wafer transit areas 40 from the OHT 31 on the auxiliary transfer line 30 of the photolithography process section 1a onto an OHT 21 on the main transfer line 20. Then, the wafers are transferred by this OHT 21 on the main transfer line 20 to another process section, such as an etching process section (not shown), in which etching is performed in accordance with the pattern. After the etching process is finished, the wafers W are subjected to another process, as needed, and may be then transferred by an OHT 21 on the main transfer line 20 to the photolithography process section 1a again and subjected to a photolithography process.

As described above, in the substrate processing system 100 according to this embodiment, the photolithography process section 1a is provided with the auxiliary transfer line 30 as a transfer mechanism independent of the main transfer line 20. Consequently, transfer of wafers relative to the respective process apparatuses can be flexibly performed in the photolithography process section 1a. Further, the process rate and wafer transfer rate used for the photolithography sequence can be controlled separately from the other process sections in the substrate processing system 100. In this case, the photolithography sequence can be performed with high throughput, and thus can deal with a transaction entailing a large load on the photolithography sequence, such as a double light exposure process. Further, the auxiliary transfer line 30 having a plurality of OHTs 31 can provide a buffer function to decrease the number of lots in process present on the main transfer line 20, so that the load on the main transfer line 20 becomes smaller.

In the arrangement described above, the resist coating process apparatus 2, light exposure process apparatuses (first light exposure process apparatus 3a and second light exposure process apparatus 3b), and developing process apparatus 5 are disposed side by side along the auxiliary transfer line 30, so that wafers W can be transferred between the apparatuses and the auxiliary transfer line 30. In this case, even if one of the apparatuses causes a problem, such as a malfunction, wafers W can be flexibly transferred to and processed by the other apparatus of the same type. Accordingly, the substrate processing system 100 including the photolithography process section 1a is improved in reliability as a whole.

The first light exposure process apparatus 3a is disposed adjacent to the first PEB process apparatus 4a for performing a heat process on a resist after a light exposure process. The second light exposure process apparatus 3b is disposed adjacent to the second PEB process apparatus 4b for performing a heat process on a resist after a light exposure process. Consequently, the time management from the light exposure process to the PEB process can be accurately performed, and the PEB process can be performed with high reproducibility. For example, where a resist of the chemical amplification type, such as ArF resist, is used, the alkali solubility is determined by the PEB process that promotes the desorption reaction of the dissolution retarding agent contained in the resist. Accordingly, the resist of the chemical amplification type requires very accurate time management and temperature management from the light exposure process to the PEB process. If the process time from the light exposure process to the PEB process is inconstant, and the planar uniformity on each wafer and uniformity among wafers are insufficient in the PEB process, ill effects are caused, such as fluctuations in line width and a decrease in etching accuracy. According to this embodiment, since the light exposure process apparatus and PEB process apparatus are disposed adjacent to each other, the time management subsequent to the light exposure is easy, and the PEB process can be performed with high accuracy. Hence, particularly, this embodiment is effectively applied to a photolithography process using a resist of the chemical amplification type, such as ArF resist.

In order to improve the productivity of the photolithography process section 1a, it is important to increase the operation rate of the light exposure process apparatus. Where only the PEB process apparatus is disposed adjacent to the light exposure process apparatus as a bare essential facility associated therewith, it is possible to decrease the risk of lowering the operation rate of the light exposure process apparatus due to a trouble of an apparatus other than the light exposure process apparatus, and thereby to improve the reliability of the photolithography process section 1a.

Second Embodiment

Figure 12:
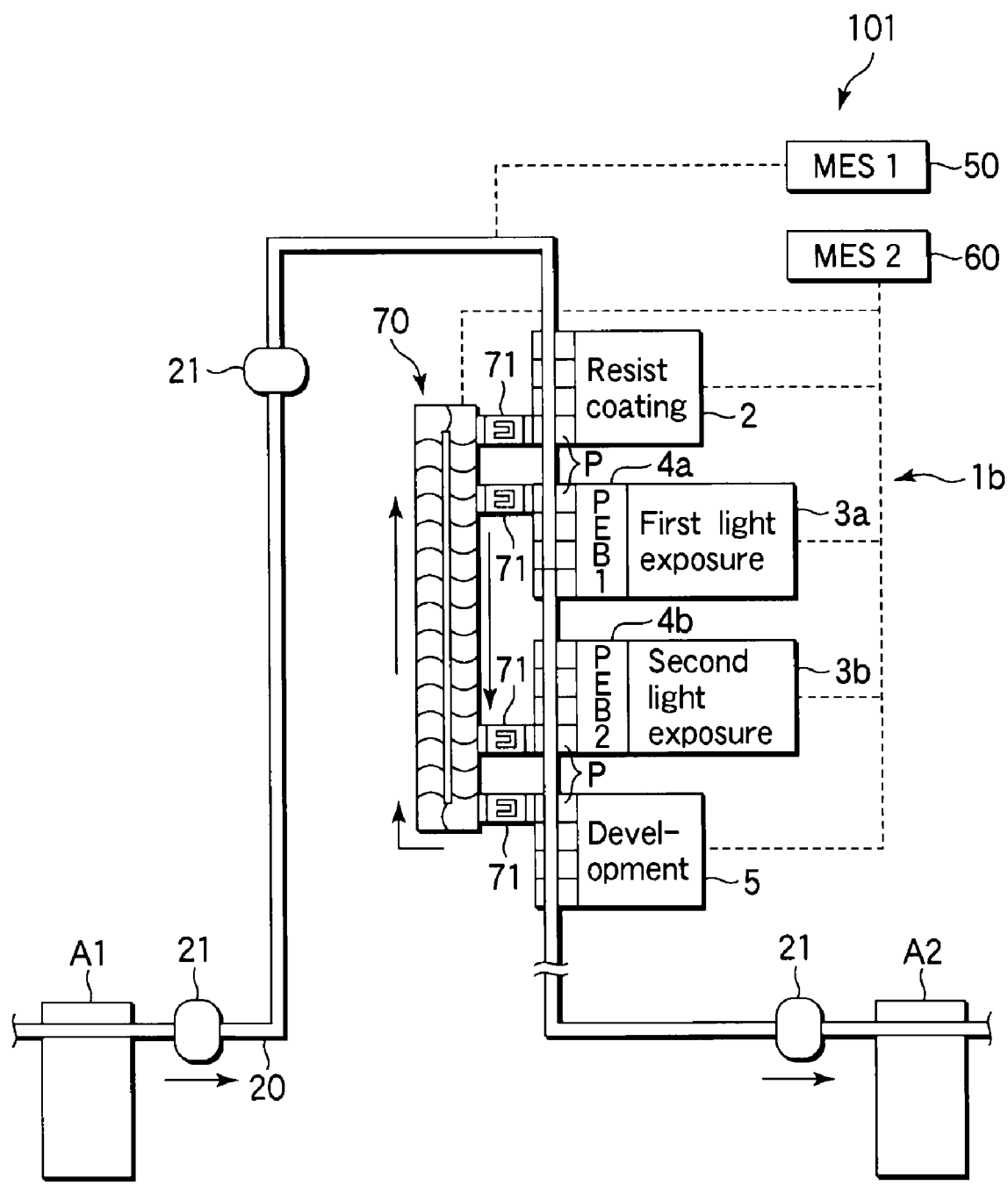
FIG. 12 is a view showing the apparatus layout of a photolithography process section used in a substrate processing system according to a second embodiment.

FIG. 12 is a view schematically showing a substrate processing system 101 according to a second embodiment of the present invention, while focusing on the transfer function around a photolithography process section 1b for performing a photolithography sequence. According to this embodiment, a conveyor 70 for conveying wafers W one by one is disposed as a second automated substrate transfer line.

As shown in FIG. 12, the photolithography process section 1b includes a resist coating process apparatus 2 for coating the surface of a wafer W with a predetermined resist; a first light exposure process apparatus 3a for performing a light exposure process on a wafer W coated with a resist; a first PEB process apparatus 4a for performing a heat process on a resist after a light exposure process; a second light exposure process apparatus 3b for performing a light exposure process on a wafer W; a second PEB process apparatus 4b for performing a heat process on a resist after a light exposure process; and a developing process apparatus 5 for performing development on a wafer W after a light exposure process. In the photolithography process section 1b, the resist coating process apparatus 2, first light exposure process apparatus 3a, second light exposure process apparatus 3b, and developing process apparatus 5 are disposed separately from each other, while the first PEB process apparatus 4a is present adjacent to the first light exposure process apparatus 3a, and the second PEB process apparatus 4b is present adjacent to the second light exposure process apparatus 3b. Wafers W are transferred between the first light exposure process apparatus 3a and the conveyor 70 through the first PEB process apparatus 4a adjacent to the first light exposure process apparatus 3a. Similarly, wafers W are transferred between the second light exposure process apparatus 3b and the conveyor 70 through the second PEB process apparatus 4b adjacent to the second light exposure process apparatus 3b. The basic structures and layouts of the respective process apparatuses are the same as those of the embodiment shown in FIG. 1.

Although not shown in FIG. 12, the photolithography process section 1b includes a plurality of groups, each of which is formed of the resist coating process apparatus 2, first and second light exposure process apparatuses 3a and 3b, first and second PEB process apparatuses 4a and 4b, and developing process apparatus 5. Accordingly, the total number of process apparatuses of each type is expressed by an integer obtained as a product of multiplication by the number of groups while the ratio of the process apparatuses included in each group is maintained.

The substrate processing system 101 includes a first automated substrate transfer line or main transfer line 20 arranged to transfer wafers W over the entire system and to transfer wafers W to and from process sections (for example, process sections A1 and A2). For example, as in the first embodiment (FIG. 1), the main transfer line 20 includes OHTs 21. Each of the OHTs 21 is configured to travel on the main transfer line 20 with a cassette (not shown) that stores wafers W, so as to transfer wafers W to and from the photolithography process section 1b and the respective process sections (for example, process sections A1 and A2).

The conveyor 70 serves as a single-substrate transfer line configured to transfer wafers W one by one. The conveyor 70 can transfer wafers to and from the cassette station serving as the transfer port of each of the process apparatuses by the corresponding one of wafer handling robots 71 disposed at a plurality of positions (four positions in FIG. 12).

According to this embodiment, each of the OHTs 21 on the main transfer line 20 can transfer a cassette that stores a plurality of wafers W to the cassette station 210 of the resist coating process apparatus 2. The cassette station 210 has a single-substrate transfer port P, and wafers W processed in the resist coating process apparatus 2 are temporarily placed in the single-substrate transfer port P. Then, the wafers W are sequentially transferred by the wafer handling robot 71 from the single-substrate transfer port P to the conveyor 70. The conveyor 70 has a loop structure to convey the wafers W one by one by circulation.

Transfer of the wafers W by the conveyor 70 is controlled with reference to the ID numbers of the wafers W, in terms of the subsequent transfer destination and transfer time of the wafers W. For example, when a wafer W is supplied onto the conveyor 70 after the resist coating process in the resist coating process apparatus 2, the subsequent transfer destination of the wafer W is selected from the first light exposure process apparatus 3a and second light exposure process apparatus 3b with reference to the ID number of the wafer W. Then, the wafer W is transferred by the wafer handling robot 71 to the single-substrate transfer port P formed in the cassette station 310 of the first PEB process apparatus 4a or second PEB process apparatus 4b, so that the wafer W is to be subjected to a light exposure process in the first light exposure process apparatus 3a or second light exposure process apparatus 3b. After the light exposure process and PEB process are finished, the wafer W is returned by the wafer handling robot 71 to the conveyor 70 through the single-substrate transfer port P formed in the cassette station 310 of the first PEB process apparatus 4a or second PEB process apparatus 4b.

Thereafter, the wafer W is transferred by the wafer handling robot 71 from the conveyor 70 to the single-substrate transfer port P formed in the cassette station 210 of the developing process apparatus 5. After the wafer W is subjected to the developing process in the developing process apparatus 5, the wafer W is transferred to the cassette station 210 of the developing process apparatus 5, and is inserted in a cassette CR. The wafers W having a predetermined pattern formed by the series of processes in the photolithography process section 1b are transferred onto an OHT 21 on the main transfer line 20. Then, the wafers are transferred by this OHT 21 on the main transfer line 20 to another process section, such as an etching process section (not shown), in which etching is performed in accordance with the pattern.

It should be noted that a cassette with wafers W stored therein can be transferred by an OHT 21 on the main transfer line 20 to any one of the cassette stations of the resist coating process apparatus 2, first PEB process apparatus 4a, second PEB process apparatus 4b, and developing process apparatus 5. In this case, each of the cassette stations can be used such that the wafers W are taken out from the cassette and are directly transferred to the single-substrate transfer port P and temporarily placed therein. In other words, wafers W stored in a cassette and transferred by an OHT 21 on the main transfer line 20 are once transferred onto the conveyor 70 before being processed in the respective apparatuses, so that the conveyor 70 can be used as a buffer inside the photolithography process section 1b. Further, transfer of wafers can be flexibly performed under the control of the second MES 60 in accordance with the operational status of the respective apparatuses in the photolithography process section 1b.

As described above, in the substrate processing system 101 according to this embodiment, the photolithography process section 1b is provided with the conveyor 70 as a transfer mechanism independent of the main transfer line 20. Consequently, transfer of wafers relative to the respective process apparatuses can be flexibly performed in the photolithography process section 1b. Further, in the photolithography process section 1b, wafers W processed in the respective process apparatuses are sequentially transferred one by one by the conveyor 70 to a process apparatus for the subsequent process. In this case, waiting time for transfer of wafers to the subsequent process apparatus becomes smaller and the throughput is thereby improved, as compared to transfer of wafers in units of a cassette, for example.

Further, with the conveyor 70 thus disposed, the process rate and wafer transfer rate used for the photolithography sequence can be controlled separately from the other process sections in the substrate processing system 101. In this case, the photolithography sequence can be performed with high throughput, and thus can deal with a transaction entailing a large load on the photolithography sequence, such as a double light exposure process. Further, the conveyor 70 can provide a buffer function to decrease the number of lots in process present on the main transfer line 20, so that the load on the main transfer line 20 becomes smaller. In addition, also in the substrate processing system 101 according to the second embodiment, the resist coating process apparatus 2, light exposure process apparatuses (first light exposure process apparatus 3a and second light exposure process apparatus 3b), and developing process apparatus 5 are disposed side by side along the conveyor 70, so that wafers W can be transferred between the apparatuses and the conveyor 70, as in the substrate processing system 100 according to the first embodiment. In this case, even if one of the apparatuses causes a problem, such as a malfunction, wafers W can be flexibly transferred to and processed by the other apparatus of the same type. Accordingly, the substrate processing system 101 including the photolithography process section 1b is improved in reliability as a whole.

The first light exposure process apparatus 3a is disposed adjacent to the first PEB process apparatus 4a for performing a heat process on a resist after a light exposure process. The second light exposure process apparatus 3b is disposed adjacent to the second PEB process apparatus 4b for performing a heat process on a resist after a light exposure process. Consequently, the PEB process can be performed with high reliability, while the time management subsequent to the light exposure is easy, and the PEB process can be performed with high accuracy. Further, it is possible to decrease the risk of lowering the operation rate of the light exposure process apparatus due to a trouble of an apparatus other than the light exposure process apparatus, and thereby to improve the reliability of the photolithography process section 1b.

Third Embodiment

Figure 13:
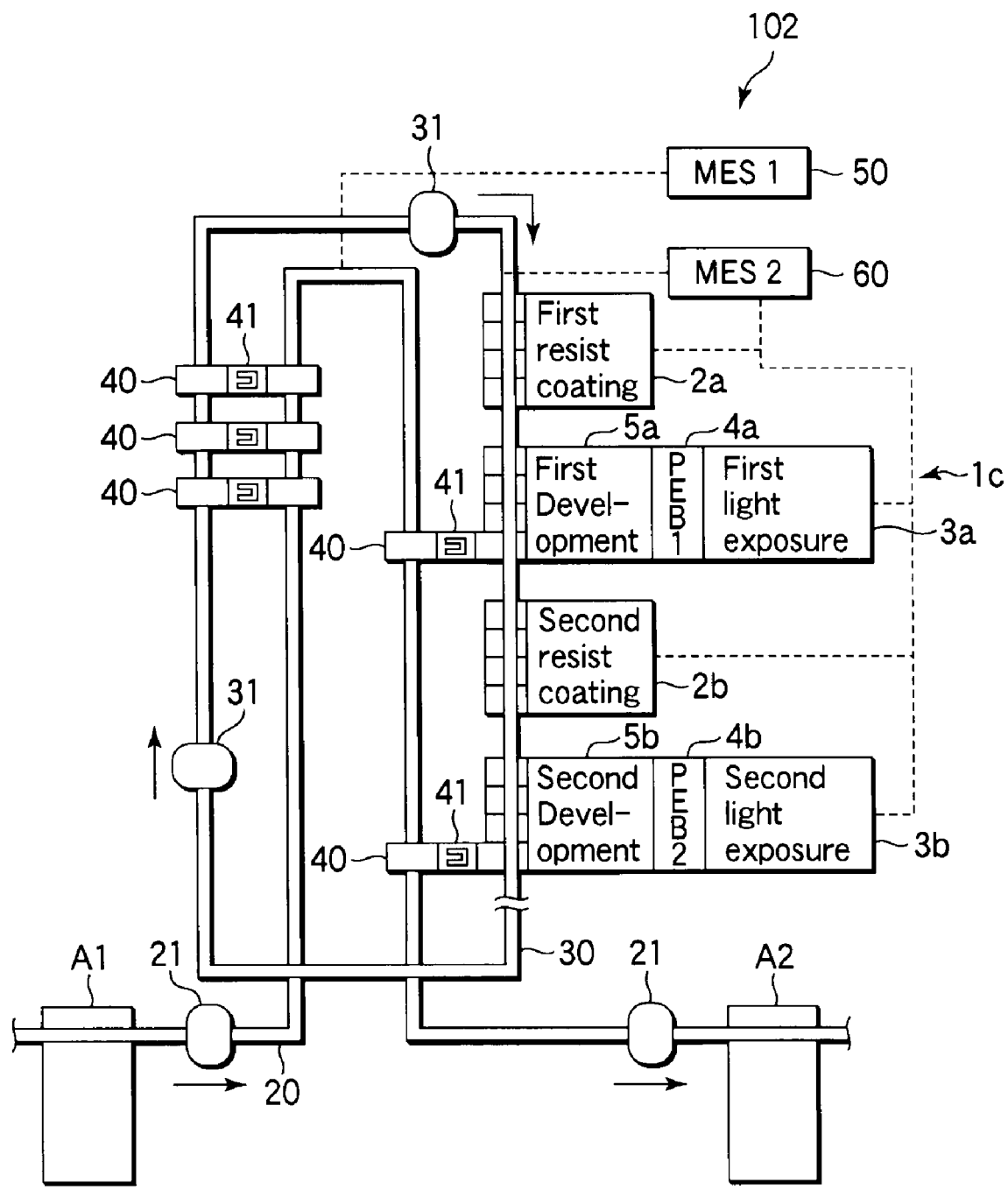
FIG. 13 is a view showing the apparatus layout of a photolithography process section used in a substrate processing system according to a third embodiment.

FIG. 13 is a view schematically showing a substrate processing system 102 according to a third embodiment of the present invention, while focusing on the transfer function around a photolithography process section 1c for performing a photolithography sequence. According to this embodiment, an auxiliary transfer line 30 is disposed as a second automated substrate transfer line, and the following apparatuses are disposed side by side along the auxiliary transfer line 30, so that wafers W can be directly transferred between the apparatuses and the auxiliary transfer line 30. These apparatuses are a first resist coating process apparatus 2a and a second resist coating process apparatus 2b each for coating the surface of a wafer W with a predetermined resist; and a first developing process apparatus 5a and a second developing process apparatus 5b each for performing development on a wafer W after a light exposure process.

The first developing process apparatus 5a is connected in series, through a first PEB process apparatus 4a for performing a heat process on a resist after a light exposure process, to a first light exposure process apparatus 3a for performing a light exposure process on a wafer W. The second developing process apparatus 5b is connected in series, through a second PEB process apparatus 4b, to a second light exposure process apparatus 3b. Wafers W are transferred between the first light exposure process apparatus 3a and the OHTs 31 on the auxiliary transfer line 30 through the first PEB process apparatus 4a and first developing process apparatus 5a. Similarly, wafers W are transferred between the second light exposure process apparatus 3b and the OHTs 31 on the auxiliary transfer line 30 through the second PEB process apparatus 4b and second developing process apparatus 5b. The system 102 according to this embodiment has the same structure as that of the substrate processing system 100 shown in FIG. 1 according to the first embodiment except that the photolithography process section 1c has a different apparatus layout.

Although not shown in FIG. 13, the photolithography process section 1c includes a plurality of groups, each of which is formed of the first and second resist coating process apparatuses 2a and 2b, first and second light exposure process apparatuses 3a and 3b, first and second PEB process apparatuses 4a and 4b, and first and second developing process apparatuses 5a and 5b. Accordingly, the total number of process apparatuses of each type is expressed by an integer obtained as a product of multiplication by the number of groups while the ratio of the process apparatuses included in each group is maintained.

In the substrate processing system 102, for example, wafers W transferred from another process section (not shown) by an OHT 21 on the main transfer line 20 are transferred at one of the wafer transit areas 40 onto an OHT 31 on the auxiliary transfer line 30 of the photolithography process section 1a. Then, the wafers are transferred by the OHTs 31 on the auxiliary transfer line 30 among the respective process apparatuses inside the photolithography process section 1c. Specifically, for example, the wafers W transferred to the photolithography process section 1c are loaded by an OHT 31 on the auxiliary transfer line 30 into one of the first resist coating process apparatus 2a and second resist coating process apparatus 2b. At this time, the wafers W can be directed under the control of the second MES 60 to one of the first resist coating process apparatus 2a and second resist coating process apparatus 2b. Accordingly, transfer of wafers can be flexibly performed in accordance with the operational status of the resist coating process apparatuses, so that the throughput of the photolithography sequence is improved.

After the wafers are subjected to the resist coating process in the first resist coating process apparatus 2a or second resist coating process apparatus 2b, the wafers W are transferred for the light exposure process by the auxiliary transfer line 30 to one of the first developing process apparatus 5a and second developing process apparatus 5b. Also at this time, the wafers W can be directed under the control of the second MES 60 to one of the first developing process apparatus 5a and second developing process apparatus 5b. Accordingly, transfer of wafers can be flexibly performed in accordance with the operational status of the developing process apparatuses and light exposure process apparatuses, so that the throughput of the photolithography sequence is improved. Then, the wafers W coated with the resist are processed by the light exposure, PEB, and development in this order. According to this embodiment, the developing process apparatus (5a or 5b) is connected to the PEB process apparatus (4a or 4b) and the light exposure process apparatus (3a or 3b) in series, and so a series of light exposure process, PEB process, and developing process can be performed with high throughput.

Further, the auxiliary transfer line 30 can provide a buffer function to decrease the number of lots in process present on the main transfer line 20, so that the load on the main transfer line 20 becomes smaller.

As described above, in the substrate processing system 102 according to this embodiment, the photolithography process section 1c is provided with the auxiliary transfer line 30 as a transfer mechanism independent of the main transfer line 20. Consequently, transfer of wafers relative to the respective process apparatuses can be flexibly performed in the photolithography process section 1c. Further, the process rate and wafer transfer rate used for the photolithography sequence can be controlled separately from the other process sections in the substrate processing system 102. In this case, the photolithography sequence can be performed with high throughput, and thus can deal with a transaction entailing a large load on the photolithography sequence, such as a double light exposure process.

In the arrangement described above, two resist coating process apparatuses (2a and 2b) and two developing process apparatuses (5a and 5b) are disposed side by side along the auxiliary transfer line 30, so that wafers W can be directly transferred between the apparatuses and the auxiliary transfer line 30. In this case, even if one of the apparatuses causes a problem, such as a malfunction, wafers W can be flexibly transferred to and processed by the other apparatus of the same type. Accordingly, the substrate processing system 102 including the photolithography process section 1c is improved in reliability as a whole.

The first light exposure process apparatus 3a is disposed adjacent to the first PEB process apparatus 4a. The second light exposure process apparatus 3b is disposed adjacent to the second PEB process apparatus 4b. Consequently, the time management subsequent to the light exposure is easy, and the PEB process can be performed with high accuracy.

Fourth Embodiment

Figure 14:
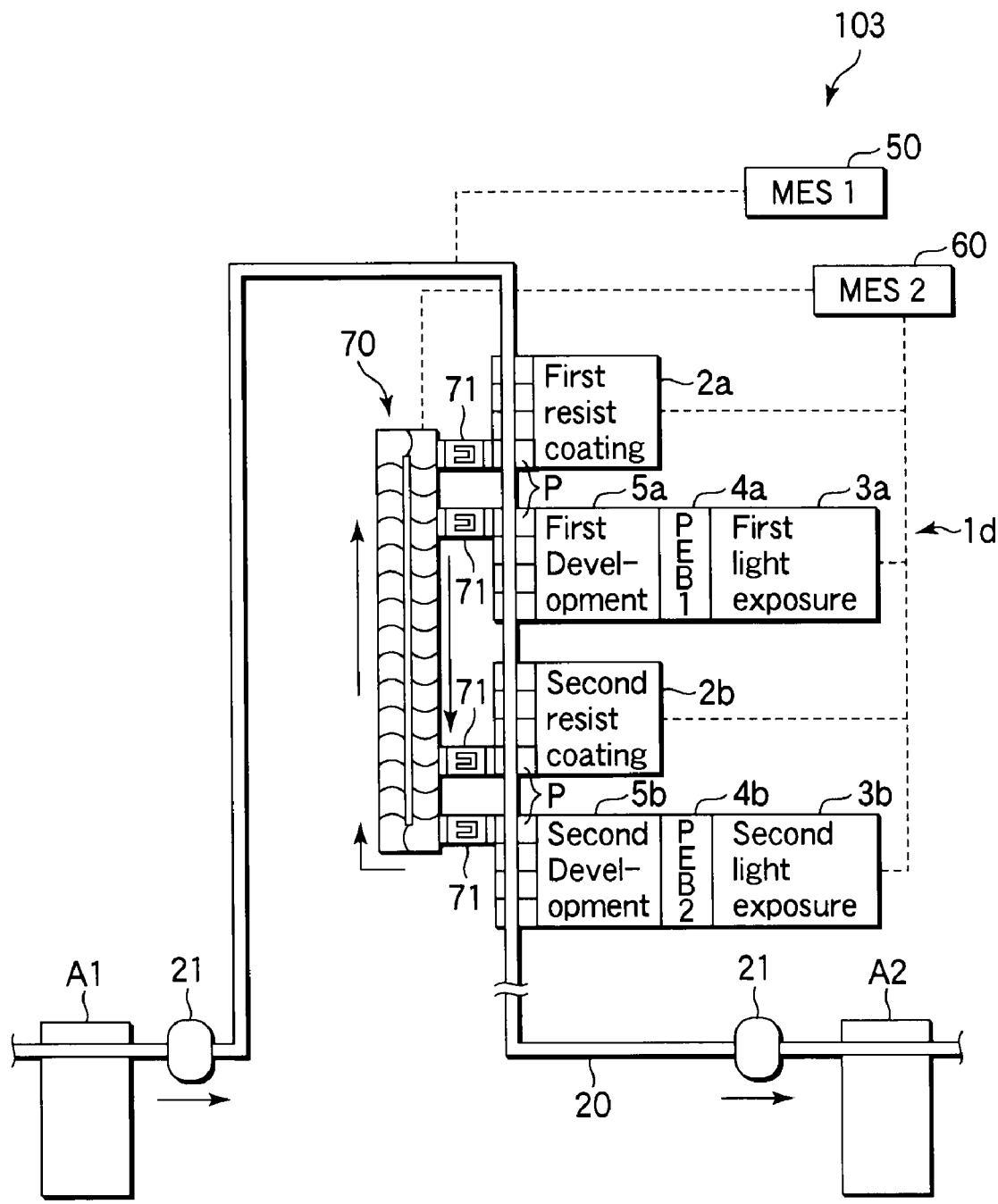
FIG. 14 is a view showing the apparatus layout of a photolithography process section used in a substrate processing system according to a fourth embodiment.

FIG. 14 is a view schematically showing a substrate processing system 103 according to a fourth embodiment of the present invention, while focusing on the transfer function around a photolithography process section 1d for performing a photolithography sequence. According to this embodiment, a conveyor 70 for conveying wafers W one by one is disposed as a second automated substrate transfer line, and the following apparatuses are disposed side by side along the conveyor 70, so that wafers W can be directly transferred between the apparatuses and the conveyor 70. These apparatuses are a first resist coating process apparatus 2a and a second resist coating process apparatus 2b each for coating the surface of a wafer W with a predetermined resist; and a first developing process apparatus 5a and a second developing process apparatus 5b each for performing development on a wafer W after a light exposure process.

The first developing process apparatus 5a is connected in series, through a first PEB process apparatus 4a for performing a heat process on a resist after a light exposure process, to a first light exposure process apparatus 3a for performing a light exposure process on a wafer W. The second developing process apparatus 5b is connected in series, through a second PEB process apparatus 4b, to a second light exposure process apparatus 3b. Wafers W are transferred between the first light exposure process apparatus 3a and the conveyor 70 through the first PEB process apparatus 4a and first developing process apparatus 5a. Similarly, wafers W are transferred between the second light exposure process apparatus 3b and the conveyor 70 through the second PEB process apparatus 4b and second developing process apparatus 5b. The system 103 according to this embodiment has the same structure as that of the substrate processing system 101 shown in FIG. 12 according to the second embodiment except that the photolithography process section 1d has a different apparatus layout.

Although not shown in FIG. 14, the photolithography process section 1d includes a plurality of groups, each of which is formed of the first and second resist coating process apparatuses 2a and 2b, first and second light exposure process apparatuses 3a and 3b, first and second PEB process apparatuses 4a and 4b, and first and second developing process apparatuses 5a and 5b. Accordingly, the total number of process apparatuses of each type is expressed by an integer obtained as a product of multiplication by the number of groups while the ratio of the process apparatuses included in each group is maintained.

In the substrate processing system 103, for example, a cassette that stores wafers W transferred from another process section (not shown) by an OHT 21 on the main transfer line 20 can be transferred to the cassette station 210 of one of the first resist coating process apparatus 2a and second resist coating process apparatus 2b. The cassette station 210 has a single-substrate transfer port P, and, for example, wafers W subjected to the resist coating process in the first resist coating process apparatus 2a or second resist coating process apparatus 2b are temporarily placed in the single-substrate transfer port P. Then, the wafers W are sequentially transferred by the wafer handling robot 71 from the single-substrate transfer port P to the conveyor 70. The conveyor 70 has a loop structure to convey the wafers W one by one by circulation.

It should be noted that a cassette with wafers W stored therein can be transferred by an OHT 21 on the main transfer line 20 to any one of the cassette stations of the first resist coating process apparatus 2a, second resist coating process apparatus 2b, first developing process apparatus 5a, and second developing process apparatus 5b. In this case, each of the cassette stations can be used such that the wafers W are taken out from the cassette and are directly transferred to the single-substrate transfer port P and temporarily placed therein. In other words, wafers W stored in a cassette and transferred by an OHT 21 on the main transfer line 20 are once transferred onto the conveyor 70 before being processed in the respective apparatuses, so that the conveyor 70 can be used as a buffer inside the photolithography process section 1d. Further, transfer of wafers can be flexibly performed under the control of the second MES 60 in accordance with the operational status of the respective apparatuses in the photolithography process section 1d.

Transfer of the wafers W by the conveyor 70 is controlled with reference to the ID numbers of the wafers W, in terms of the subsequent transfer destination and transfer time of the wafers W. For example, when the wafers W are transferred on the conveyor 70 having a loop shape, the wafers W can be directed under the control of the second MES 60 to one of the first resist coating process apparatus 2a and second resist coating process apparatus 2b. Accordingly, transfer of wafers can be flexibly performed in accordance with the operational status of the resist coating process apparatuses, so that the throughput of the photolithography sequence is improved. After the wafers are subjected to the resist coating process in the first resist coating process apparatus 2a or second resist coating process apparatus 2b, the wafers W are transferred for the light exposure process by the conveyor 70 to one of the first developing process apparatus 5a and second developing process apparatus 5b. Also at this time, the wafers W can be directed under the control of the second MES 60 to one of the first developing process apparatus 5a and second developing process apparatus 5b. Accordingly, transfer of wafers can be flexibly performed in accordance with the operational status of the developing process apparatuses and light exposure process apparatuses, so that the throughput of the photolithography sequence is improved. Then, the wafers W coated with the resist are processed by the light exposure, PEB, and development in this order. According to this embodiment, the developing process apparatus (5a or 5b) is connected to the PEB process apparatus (4a or 4b) and the light exposure process apparatus (3a or 3b) in series, and so a series of light exposure process, PEB process, and developing process can be performed with high throughput.

As described above, in the substrate processing system 103 according to this embodiment, the photolithography process section 1d is provided with the conveyor 70 as a transfer mechanism independent of the main transfer line 20. Consequently, transfer of wafers relative to the respective process apparatuses can be flexibly performed in the photolithography process section 1d. Further, in the photolithography process section 1d, wafers W processed in the respective process apparatuses are sequentially transferred one by one by the conveyor 70 to a process apparatus for the subsequent process. In this case, waiting time for transfer of wafers to the subsequent process apparatus becomes smaller and the throughput is thereby improved, as compared to transfer of wafers in units of a cassette, for example. Further, with the conveyor 70 thus disposed, the process rate and wafer transfer rate used for the photolithography sequence can be controlled separately from the other process sections in the substrate processing system 103. In this case, the photolithography sequence can be performed with high throughput, and thus can deal with a transaction entailing a large load on the photolithography sequence, such as a double light exposure process.

Further, the conveyor 70 can provide a buffer function to decrease the number of lots in process present on the main transfer line 20, so that the load on the main transfer line 20 becomes smaller.

In the arrangement described above, two resist coating process apparatuses (2a and 2b) and two developing process apparatuses (5a and 5b) are disposed side by side along the conveyor 70, so that wafers W can be directly transferred between the apparatuses and the conveyor 70. In this case, even if one of the apparatuses causes a problem, such as a malfunction, wafers W can be flexibly transferred to and processed by the other apparatus of the same type. Accordingly, the substrate processing system 103 including the photolithography process section 1d is improved in reliability as a whole.

The first light exposure process apparatus 3a is disposed adjacent to the first PEB process apparatus 4a. The second light exposure process apparatus 3b is disposed adjacent to the second PEB process apparatus 4b. Consequently, the time management subsequent to the light exposure is easy, and the PEB process can be performed with high accuracy.

According to the first to fourth embodiments of the present invention, a first automated substrate transfer line is configured to transfer target substrates among a plurality of process sections for respectively performing processes on the target substrates. Further, a second automated substrate transfer line is individually disposed relative to the first automated substrate transfer line, such that the target substrates can be transferred between the first automated substrate transfer line and second automated substrate transfer line. The second automated substrate transfer line is configured to transfer the target substrates among respective process apparatuses for performing a series of processes in a photolithography sequence. Consequently, transfer of wafers relative to the respective process apparatuses can be flexibly performed in the photolithography process section. Further, the process rate and substrate transfer rate used for the photolithography sequence can be controlled separately from the other process sections in the substrate processing system. In this case, the photolithography sequence can be performed with high throughput, and thus can deal with a transaction entailing a large load on the photolithography sequence, such as a double light exposure process. Further, the second automated substrate transfer line can provide a buffer function to decrease the number of lots in process present on the first automated substrate transfer line, so that the load on the first automated substrate transfer line becomes smaller.

The present invention has been described with reference to several embodiments, but the present invention is not limited to these embodiments, and it may be modified in various manners. For example, in the apparatus layout of each of the first to fourth embodiments (FIGS. 1, 12, 13, and 14), the numbers of resist coating process apparatuses, PEB process apparatuses, light exposure process apparatuses, and developing process apparatuses may be further increased. In this case, as described above, the numbers of process apparatuses are preferably increased as a whole while the ratio of the process apparatuses shown in each of FIGS. 1, 12, 13, and 14 is maintained. However, the number of process apparatuses of a specific type, such as resist coating process apparatuses, may be solely increased.

According to the embodiments described above, the substrate processing system is designed to perform a series of resist coating, light exposure, and development in a photolithography sequence on semiconductor wafers. Alternatively, the present invention may be applied to a substrate processing system designed to perform a process including a photolithography sequence on target substrates other than semiconductor wafers, such as glass substrates for FPDs (Flat panel display).

INDUSTRIAL APPLICABILITY

The present invention is applicable to a substrate process for performing a process including a photolithography sequence on target substrates, such as semiconductor wafers.

The invention claimed is:

1. A substrate processing system for performing a process including a photolithography sequence on target substrates, the substrate processing system comprising:
a first automated substrate transfer line configured to transfer the target substrates among a plurality of process sections for respectively performing processes on the target substrates;
a photolithography process section configured to perform a series of processes in the photolithography sequence and located relative to the first automated substrate transfer line so as for the target substrates to be transferred therebetween; and
a second automated substrate transfer line configured to transfer the target substrates among process apparatuses in the photolithography process section,
wherein the second automated substrate transfer line is a cyclical substrate transfer line, which is formed as a loop independent of the first automated substrate transfer line and connects the process apparatuses in the photolithography process section to each other,
the first automated substrate transfer line includes an outer line portion, which is present outside the loop of the second automated substrate transfer line and is connected to another process section of the plurality of process sections, and an intervening line portion having a U-shape, which projects from the outer line portion into the loop and extends along the loop inside the loop,
the intervening line portion is connected to the loop by first and second transit portions each including a substrate handling robot, and
at least one of the first and second transit portions connects the intervening line portion to the loop at a first position in front of one of the process apparatuses in the photolithography process section.

2. The substrate processing system according to claim 1, wherein the
first automated substrate transfer line includes a first transfer unit configured to travel on a first track to transfer the target substrates to and from the process sections, and the second automated substrate transfer line includes
a second transfer unit configured to travel on a second track to transfer the target substrates to and from the respective process apparatuses in the photolithography process section, and each of the first and the second transfer units is a container transfer unit configured to transfer a container with a plurality of target substrates stored therein.

3. The substrate processing system according to claim 1, wherein the substrate processing system comprises:
a first control section configured to control transfer of the target substrates on the first automated substrate transfer line; and
a second control section configured to control transfer of the target substrates on the second automated substrate transfer line.

4. The substrate processing system according to claim 1, wherein the photolithography process section comprises a resist coating process apparatus, a light exposure process apparatus, and a developing process apparatus.

5. The substrate processing system according to claim 4, wherein the photolithography process section is arranged such that at least the resist coating process apparatus and the developing process apparatus are disposed separately from each other and each located relative to the second automated substrate transfer line so as for the target substrates to be transferred therebetween.

6. The substrate processing system according to claim 4, wherein the photolithography process section is arranged such that the resist coating process apparatus, the light exposure process apparatus, and the developing process apparatus are disposed separately from each other and each located relative to the second automated substrate transfer line so as for the target substrates to be transferred therebetween.

7. The substrate processing system according to claim 5, wherein each of the resist coating process apparatus and the developing process apparatus includes a substrate transfer port through which the target substrates are transferred to and from the second automated substrate transfer line.

8. The substrate processing system according to claim 4, wherein the number of resist coating process apparatuses and the number of light exposure process apparatuses disposed in the system are set at a ratio of 1:2.

9. The substrate processing system according to claim 4, wherein a post-light-exposure baking process apparatus is disposed adjacent to the light exposure process apparatus.

10. The substrate processing system according to claim 1, wherein the photolithography process section is a process section configured to perform pattern formation by use of a double light exposure technique.

11. The substrate processing system according to claim 1, wherein the other one of the first and second transit portions connects the intervening line portion to the loop at a second position distant from the process apparatuses in the photolithography process section.

12. A substrate processing system for performing a process including a photolithography sequence on target substrates, the substrate processing system comprising:
a first automated substrate transfer line configured to transfer the target substrates among a plurality of process sections for respectively performing processes on the target substrates;
a photolithography process section configured to perform a series of processes in the photolithography sequence and located relative to the first automated substrate transfer line so as for the target substrates to be transferred therebetween; and
a second automated substrate transfer line configured to transfer the target substrates among process apparatuses in the photolithography process section,
wherein the second automated substrate transfer line includes a cyclical conveyor, which is formed as a loop independent of the first automated substrate transfer line and connects the process apparatuses in the photolithography process section to each other to transfer the target substrates one by one,
the cyclical conveyor is connected to the process apparatuses in the photolithography process section by transit portions each including a substrate handling robot,
the first automated substrate transfer line includes a container transfer unit configured to transfer a container with a plurality of target substrates stored therein and to travel on its track to transfer the target substrates to and from the process sections, and
the first automated substrate transfer line includes an outer line portion connected to another process section of the plurality of process sections, and a diverted line portion having a U-shape, which projects from the outer line portion to surround the cyclical conveyor and is connected to the process apparatuses in the photolithography process section without the cyclical conveyor intermediating therebetween.

13. The substrate processing system according to claim 12, wherein the substrate processing system comprises:
a first control section configured to control transfer of the target substrates on the first automated substrate transfer line; and
a second control section configured to control transfer of the target substrates on the second automated substrate transfer line.

14. The substrate processing system according to claim 12, wherein the photolithography process section comprises a resist coating process apparatus, a light exposure process apparatus, and a developing process apparatus.

15. The substrate processing system according to claim 14, wherein the photolithography process section is arranged such that at least the resist coating process apparatus and the developing process apparatus are disposed separately from each other and each located relative to the second automated substrate transfer line so as for the target substrates to be transferred therebetween.

16. The substrate processing system according to claim 14, wherein the photolithography process section is arranged such that the resist coating process apparatus, the light exposure process apparatus, and the developing process apparatus are disposed separately from each other and each located relative to the second automated substrate transfer line so as for the target substrates to be transferred therebetween.

17. The substrate processing system according to claim 15, wherein each of the resist coating process apparatus and the developing process apparatus includes a substrate transfer port through which the target substrates are transferred to and from the second automated substrate transfer line.

18. The substrate processing system according to claim 14, wherein the number of resist coating process apparatuses and the number of light exposure process apparatuses disposed in the system are set at a ratio of 1:2.

19. The substrate processing system according to claim 14, wherein a post-light-exposure baking process apparatus is disposed adjacent to the light exposure process apparatus.

20. The substrate processing system according to claim 12, wherein the photolithography process section is a process section configured to perform pattern formation by use of a double light exposure technique.

* * * * *